(12) United States Patent
Venkatraman et al.

(10) Patent No.: US 8,034,685 B1
(45) Date of Patent: Oct. 11, 2011

(54) SEMICONDUCTOR COMPONENT AND METHOD OF MANUFACTURE

(75) Inventors: Prasad Venkatraman, Gilbert, AZ (US); Zia Hossain, Tempe, AZ (US); Kirk K. Huang, Chandler, AZ (US)

(73) Assignee: Semiconductor Component Industries, LLC, Phoenix, AZ (US)

( * ) Notice: Subject to any disclaimer, the term of this patent is extended or adjusted under 35 U.S.C. 154(b) by 0 days.

(21) Appl. No.: 12/771,869

(22) Filed: Apr. 30, 2010

(51) Int. Cl.
*H01L 21/336* (2006.01)

(52) U.S. Cl. ...................................................... 438/270

(58) Field of Classification Search .................. None
See application file for complete search history.

(56) References Cited

U.S. PATENT DOCUMENTS

| | | | |
|---|---|---|---|
| 6,930,473 | B2 | 8/2005 | Elbanhawy |
| 7,495,877 | B2 | 2/2009 | Havanur |
| 2004/0113230 | A1* | 6/2004 | Divakaruni et al. ........... 257/510 |
| 2010/0123171 | A1* | 5/2010 | Yang et al. ...................... 257/272 |
| 2010/0151643 | A1* | 6/2010 | Hirler ............................ 438/270 |

* cited by examiner

*Primary Examiner* — Charles Garber
*Assistant Examiner* — Andre Stevenson
(74) *Attorney, Agent, or Firm* — Rennie William Dover

(57) ABSTRACT

A semiconductor component that includes gate electrodes and shield electrodes and a method of manufacturing the semiconductor component. A semiconductor material has a device region, a gate contact region, a termination region, and a drain contact region. One or more device trenches is formed in the device region and one or more termination trenches is formed in the edge termination region. Shield electrodes are formed in portions of the device trenches that are adjacent their floors. A gate dielectric material is formed on the sidewalls of the trenches in the device region and gate electrodes are formed over and electrically isolated from the shield electrodes. A gate electrode in at least one of the trenches is connected to at least one shield electrode in the trenches.

26 Claims, 39 Drawing Sheets

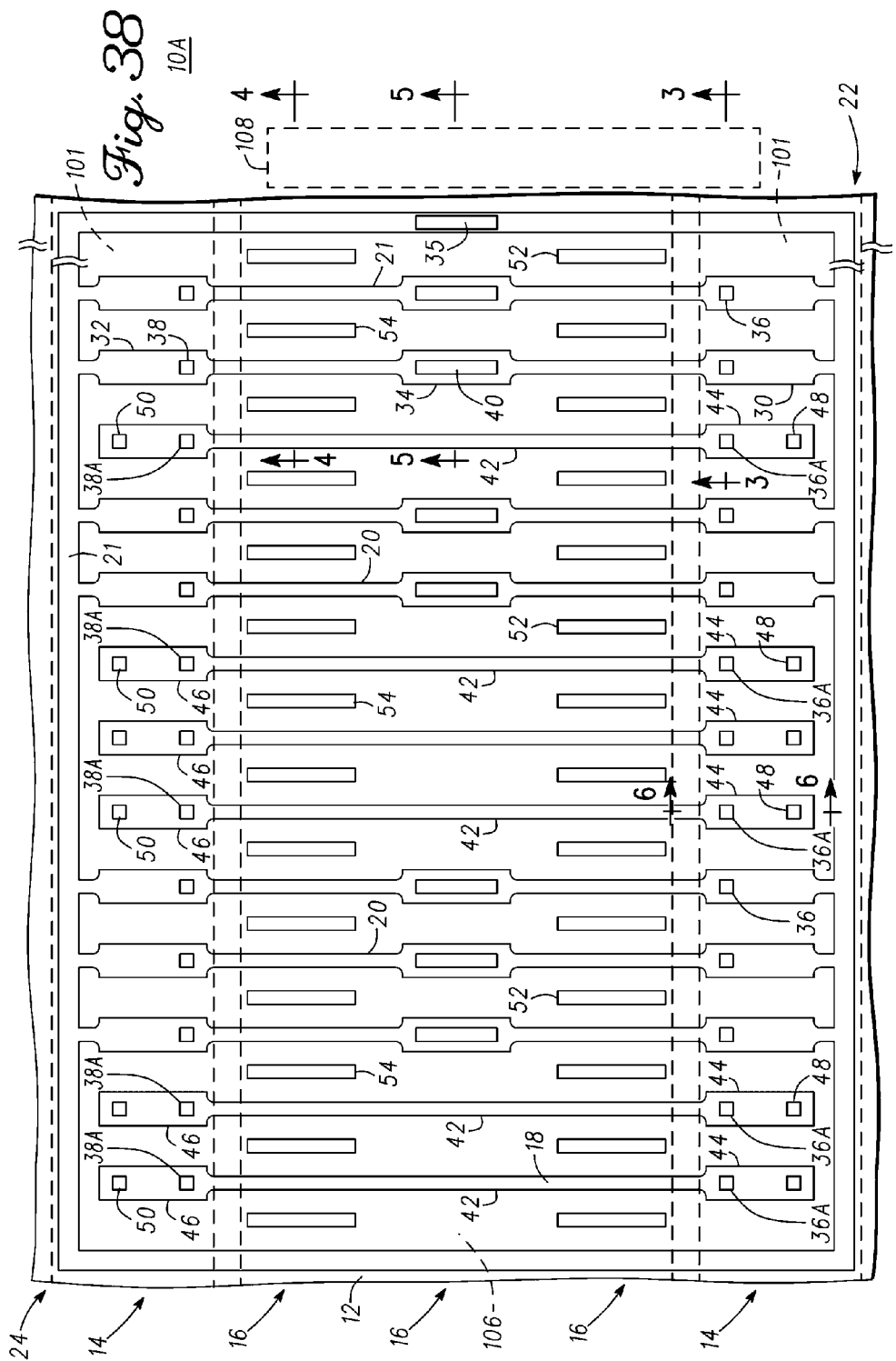

US 8,034,685 B1

SEMICONDUCTOR COMPONENT AND METHOD OF MANUFACTURE

TECHNICAL FIELD

The present invention relates, in general, to electronics and, more particularly, to semiconductor components and their manufacture.

BACKGROUND

Metal-Oxide Semiconductor Field Effect Transistors ("MOSFETS") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

In the past, the semiconductor industry used various different device structures and methods to form MOSFETS. One particular structure for a vertical power MOSFET used trenches that were formed in an active area of the MOSFET. A portion of those trenches were used as the gate regions of the transistor. Some of these transistors also had a shield conductor that assisted in lowering the gate-to-drain capacitance of the transistor. Lowering the gate-to-drain capacitance of the transistors increases the transition rate of their drain-to-source voltage during turn-on and turn-off of the transistors. A low gate-to-drain capacitance reduces the switching power losses of the MOSFET, and hence results in increased efficiency in some applications. However, in applications in which the MOSFET serves as, for example, a high side FET, where its source is coupled to the drain of a low side FET to form a switch node, the increased transition rate during turn-off may lead to ringing at the switch node. The ringing becomes more pronounced in packages having a high source inductance and can cause the systems in which the transistors are used to malfunction and dissipate a large amount of energy.

Accordingly, it would be advantageous to have a semiconductor component and a method for forming the semiconductor component that predictably and reliably optimizes the gate-to-drain capacitance of a FET to achieve a good trade-off between efficiency and switch node ringing. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which:

FIG. 38 is a plan view of a semiconductor component during manufacture in accordance with another embodiment of the present invention.

Figure 1:
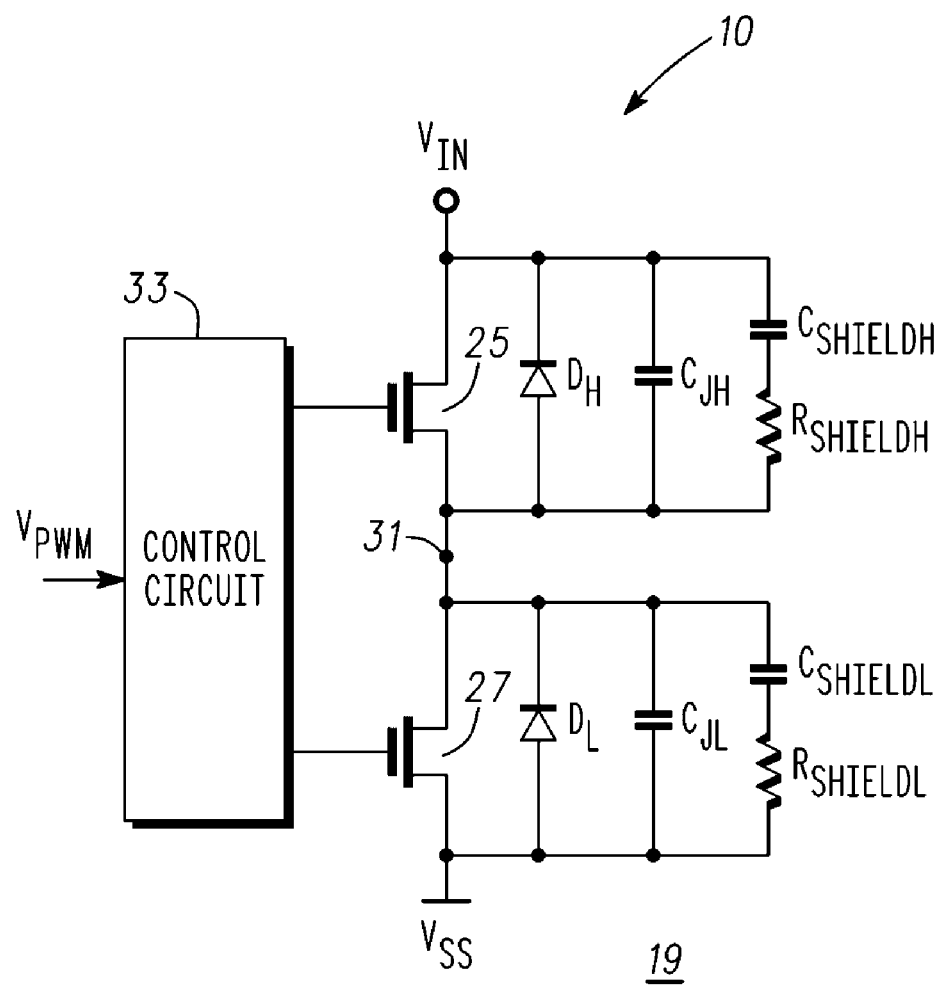
FIG. 1 is a schematic of a circuit that includes semiconductor components in accordance with embodiments of the present invention.

For simplicity and clarity of the illustration, elements in the figures are not necessarily drawn to scale and the same reference characters in different figures denote the same elements. Additionally, descriptions and details of well-known steps and elements are omitted for simplicity of the description. As used herein current carrying electrode means an element of a device that carries current through the device such as a source or a drain of a MOSFET, or an emitter or a collector of a bipolar transistor, or a cathode or an anode of a diode, and a control electrode means an element of the device that controls current through the device such as a gate of a MOSFET or a base of a bipolar transistor. Although the devices are explained herein as certain N-channel or P-channel devices, or having certain N-type or P-type doped regions, a person of ordinary skill in the art will appreciate that complementary devices are also possible in accordance with embodiments of the present invention. The use of the words approximately or about means that a value of an element has a parameter that is expected to be very close to a stated value or position or state. However, it is well known in the art that there are always minor variances that prevent the values or positions from being exactly as stated. It is well established in the art that variances of up to about ten percent (10%) (and up to twenty percent (20%) for semiconductor doping concentrations) are regarded as reasonable variance from the ideal goal as described. For clarity of the drawings, doped regions of semiconductor component structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) or a single body design (where the body region is comprised of a single region formed in an elongated pattern, typically in a serpentine pattern or formed in a plurality of stripes). However, it is intended that the description is applicable to both a cellular implementation and a single base implementation.

In some instances, well-known methods, procedures, components, and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

Generally, the present invention provides a semiconductor component having one or more trenches in which a shield electrode and a gate electrode are formed. FIG. 1 is a schematic of a circuit 19 having a semiconductor component 10 manufactured in accordance with embodiments of the present invention. Circuit 19 includes a control or driver circuit 33 coupled to semiconductor component 10. Semiconductor component 10 includes a high side FET 25 connected to a low side FET 27. More particularly, high side FET 25 has a drain coupled for receiving an input signal $V_{IN}$, a source connected to a drain of low side FET 27 to form a phase or switching node 31, and a gate coupled for receiving a gate drive signal from a control circuit 33. Low side FET 27 has a source coupled for receiving a source of operating potential $V_{SS}$ and a gate coupled for receiving a gate drive signal from control circuit 33. A parasitic diode $D_H$ and a parasitic junction capacitance $C_{JH}$ are formed from the drain to the source of high side FET 25. A series connected parasitic shield capacitance ($C_{SHIELDH}$) and a parasitic shield resistance ($R_{SHIELDH}$) are formed from the drain to the source of high side FET 25. A parasitic diode $D_L$ and a parasitic junction capacitance $C_{JL}$ are formed from the drain to the source of low side FET 27. A series connected parasitic shield capacitance ($C_{SHIELDL}$) and a parasitic shield resistance ($R_{SHIELDL}$) are formed from the drain to the source of low side FET 27.

Control circuit 33 has an input coupled for receiving a Pulse Width Modulation (PWM) Signal, $V_{PWM}$, an output connected to the gate of high side FET 25, and another output connected to the gate of low side FET 27.

In accordance with an aspect of the present invention, trenches are lined with a dielectric material such as, for example, an oxide layer, and polysilicon shield electrodes are formed over the oxide layer in one or more of the trenches. A portion of the oxide layer is removed to expose portions of the sidewalls of the trenches and top surfaces of the electrical conductors. A dielectric material is formed over the top surfaces of the electrically conductive materials. A gate dielectric material such as, for example, a gate oxide, may be formed on the sidewalls and over the dielectric material in one or more of the trenches. Gate electrodes are formed over the gate dielectric material. A predetermined percentage of the shield electrodes are connected to the gate electrodes to increase the gate-to-drain capacitance to a desired value that mitigates ringing. Some or all of the remaining shield electrodes may be connected to the source electrodes.

In accordance with another aspect of the present invention, the shield electrodes are connected to the gate electrodes by disconnecting the trenches containing the shield electrodes from the other trenches in the trench array and connecting the shield electrodes in the trenches that have been disconnected to the electrically conductive material that forms the gate electrode. In addition to increasing the gate-to-drain capacitance, the on resistance (Rds(on)) of the FET is reduced because a portion of the shield electrodes are connected to the gate electrodes allowing for the formation of an accumulation layer on the bottom portions of the trench sidewalls when the device is on.

In accordance with another aspect of the present invention, trenches are placed underlying the gate pads and lined with a thick dielectric layer. Electrical conductors are formed over the thick dielectric layers in the trenches to support the breakdown voltage BVdss. The electrical conductors underlying the gate pads are connected to the gate electrode, thereby increasing the gate-to-drain capacitance. The gate-to-drain capacitance can be adjusted by varying the number of trenches formed underlying the gate pad. Although the trenches have been described as being formed under the gate pads, this is not a limitation of the present invention. The trenches can be placed anywhere in the semiconductor die.

In accordance with another aspect of the present invention, the gate-to-drain capacitance per unit area may be increased by forming a dopant layer in the portions of the semiconductor material between the trenches that underlie the gate pad and adjacent to the surface of the semiconductor material.

In accordance with another aspect of the present invention, the series resistance of the shield electrode is adjusted to damp ringing. In a shielded FET, a large percentage of the output capacitance is the oxide capacitance from the shield electrode to the drain electrode. The shield-to-drain capacitance appears in parallel with the drain-to-source capacitance and acts with its associated series resistance to form an integrated snubber in converter applications. The series resistance of the shield electrode may be adjusted by contacting the shield electrode at a single location along each trench. Alternatively, the series resistance of the shield electrode may be adjusted by connecting two or more of the shield electrodes together at regions near the ends of the trenches and contacting the shield electrode and the source electrode in one out of N trenches. Preferably, N is an integer ranging from two to one hundred. Even more preferably, N is an integer that ranges from two to ten.

In a high side FET, increasing the shield resistance slows down the switching of the MOSFET since the shield electrode is not strongly coupled to the source electrode, and hence is not as effective at reducing the gate-to-drain capacitance during switching. This reduces the switch node ringing during turn-off of the high side FET.

In a low side FET, increasing the resistance of the shield electrode reduces the switch node ringing during turn-on of the high side FET. It also reduces the reverse recovery charge (Qrr) of the low side FET and increases the softness factor. This is important in converters such as, for example, Buck converters because the body diode of the low side FET is forward biased during the dead time when both the high and low side FETS are off. The output capacitance of a power MOSFET appears in parallel with the body diode and therefore is charged or discharged every time the drain voltage is switched.

Figure 2:
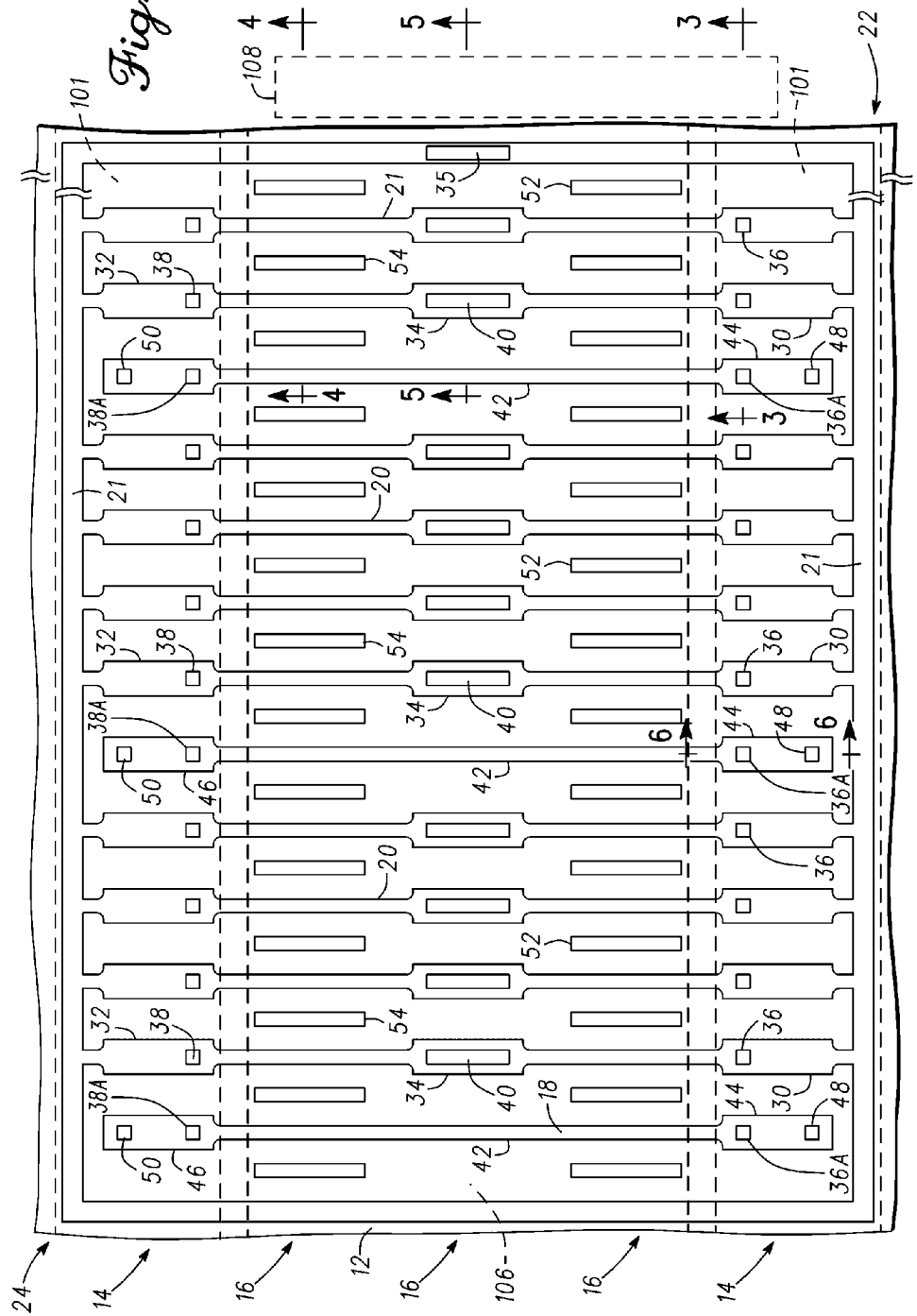
FIG. 2 is a plan view of a semiconductor component during manufacture in accordance with an embodiment of the present invention.

FIG. 2 is an enlarged plan view of a semiconductor component 10 in accordance with an embodiment of the present invention. What is shown in FIG. 2 is a portion of a semiconductor die or semiconductor chip 12 having edge regions 14 and a center region 16. It should be noted that semiconductor component 10 comprises semiconductor chip 12. Thus, elements of semiconductor chip 12 are also elements of semiconductor component 10. Edge regions 14 are also referred to as a die edge or inactive area and center region 16 is also referred to as a die center or active area. A peripherally located shield electrode trench 21 is formed in edge regions or inactive area 14 and around active area 16. A peripheral portion 82B of a shield electrode 81 is formed in peripheral shield electrode trench 21. The peripheral portion 82B of shield electrode 81 serves as a termination structure for semiconductor component 10. Preferably, an oxide thickness in peripheral portion 82B is selected to adjust the breakdown voltage of the semiconductor component 10. A plurality of trenches 20 extend from a portion of peripheral shield electrode trench 21 adjacent a side 22 of semiconductor die 12 to a portion of peripheral shield electrode trench 21 adjacent a side 24 of semiconductor die 12. Trenches 20 have gate contact portions 30 near side 22, gate contact portions 32 near side 24, and centrally located shield contact portions 34. Centrally located shield contact portions 34 may be referred to as central shield contact portions. Central portions 82 and 82A of shield electrode 81 are formed from trenches 20 and 42, respectively. It should be noted that gate contact portions 30 and 32 and central shield contact portions 34 of trenches 20 may be wider than the portions of trenches 20 between gate contact portions 30 and central shield contact portions 34 and may be wider than the portions of trenches 20 between central shield contact portions 34 and gate contact portions 32 to allow for the formation of gate contacts 36 in gate contact portions 30, gate contacts 38 in gate contact portions 32, and shield-to-source contacts 40 in central shield contact portions 34. Although trenches 20, 21, and 42 are shown as having wider portions for the formation of contacts, this is not a limitation of the present invention. For example, trenches 20, 21, and 42 may have the same width along their lengths. In addition, in various embodiments the ends of trenches 42 are spaced apart from trench 21 and the ends of trenches 20 are in contact with trench 21. It should be noted that peripheral portion 82B of shield electrode 81 may be referred to as a peripheral shielding electrode or a peripheral shield electrode and central portions 82 and 82B of shield electrode 81 may be referred to as central shielding electrodes or central shield electrodes.

A plurality of trenches 42 are formed between and spaced apart from peripheral shield electrode trench 21, where trenches 42 extend from side 22 to side 24 of semiconductor die 12. Trenches 42 have gate-to-shield contact portions 44 near side 22 and gate-to-shield contact portions 46 near side 24. Gate-to-shield contact portions 44 include gate contacts 36A and peripheral shield contacts 48 and gate-to-shield contact portions 46 include gate contacts 38A and peripheral shield contacts 50. Gate-to-shield contact portions 44 and 46 are also referred to as peripheral shield contact portions. In accordance with embodiments of the present invention, trenches 42 have substantially the same width along their lengths between gate-to-shield portions 44 and 46. Gate contacts 36A are electrically connected to peripheral shield contacts 48 and gate contacts 38A are electrically connected to peripheral shield contacts 50. Thus, the shield electrodes of some of the field effect transistors are connected to the gate electrode. It should be understood that a gate feed metallization system may be formed over portions of gate contact portions 30 and 32, which electrically connects gate contacts 36A to peripheral shield contacts 48 and gate contacts 38A to peripheral shield interconnects 50. Connecting the shield electrodes to the gate electrode increases the gate-to-drain capacitance of semiconductor component 10, which reduces the ringing on the falling edge at switch node 31 (shown in FIG. 1) when the field effect transistor is used as, for example, a high side field effect transistor. The number of shield electrodes connected to the gate electrode is selected in accordance with the desired increase in gate-to-drain capacitance. FIG. 2 shows that 20 percent of the shield electrodes are connected to the gate electrode, i.e., one out of five shield electrodes are connected to the gate electrode. This is not a limitation of the present invention. For example, one out of two of the shield electrodes may be connected to the gate electrode, one out of three of the shield electrodes may be connected to the gate electrode, one out of four of the shield electrodes may be connected to the gate electrode, etc.

It should be noted that the present invention is not limited to having one out of N shield electrodes connected to the gate electrode. Alternatively, one or more trenches 42 may be adjacent to each other such that the number N varies in the same semiconductor die.

Figure 3:
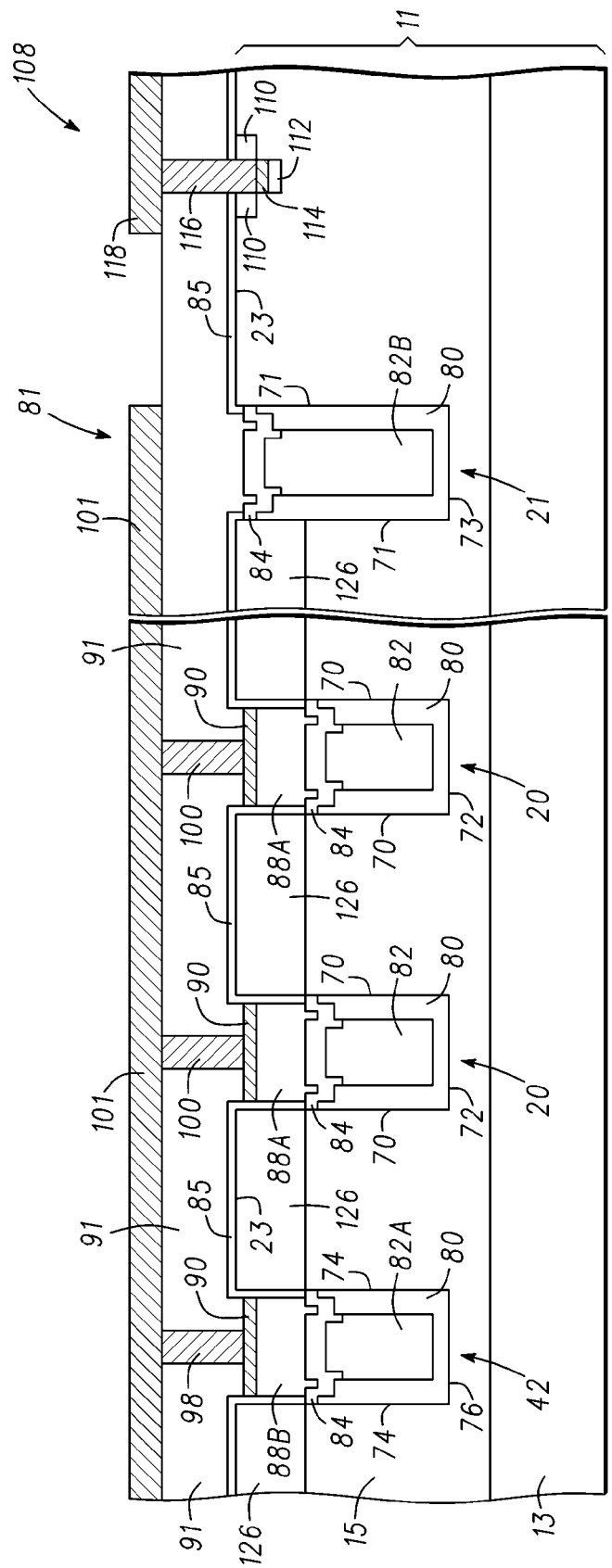
FIG. 3 is cross-sectional view of a portion of the semiconductor component of FIG. 2 taken along the region of section line 3-3 of FIG. 2 but at a later stage of manufacture.

FIG. 3 is a cross-sectional view of a semiconductor component 10 in accordance with an embodiment of the present invention, where the cross-sectional view is taken along section line 3-3 of FIG. 2. The cross-sectional view of semiconductor component 10 illustrates a portion of edge region 14 adjacent to side 22. What is shown in FIG. 3 are trenches 20, 21, and 42 extending into semiconductor material 11, where trench 21 has sidewalls 71 and a floor 73, trenches 20 have sidewalls 70 and floors 72, and trenches 42 have sidewalls 74 and floors 76. By way of example, semiconductor material 11 is comprised of an epitaxial layer 15 formed on a substrate layer 13 and has a surface 23. A layer of dielectric material 80 is formed along sidewalls 70, 71, and 74 and over floors 72, 73, and 76. An electrically conductive material 82 is formed on dielectric layer 80 in trenches 20, an electrically conductive material 82B is formed on dielectric layer 80 in trench 21, and an electrically conductive material 82A is formed on dielectric layer 80 in trenches 42. In accordance with embodiments, trenches 20 and 42 are substantially parallel to each other. By way of example, electrically conductive material 82, 82A, and 82B is doped polysilicon. Preferably, electrically conductive material 82B vertically fills more of trench 21 than electrically conductive materials 82 and 82A vertically fill trenches 20 and 42, respectively. That is, the top of electrically conductive material 82B is closer to surface 23 than the top of electrically conductive material 82 and the top of electrically conductive material 82A. A dielectric material 84 is formed over electrically conductive material 82, 82A, and 82B, and a layer of dielectric material 85 is formed on or from surface 23. Alternatively, a single dielectric layer may be formed over electrically conductive material 82, 82A, and 82B, i.e., dielectric material 84 and 85 may be replaced by a single layer of dielectric material. Electrically conductive material 82, 82A, and 82B form portions of shield electrode 81. Hence electrically conductive material 82, 82A, and 82B may be referred to as shield electrodes. Gate electrodes 88A are formed over shield electrodes 82 and the portions of dielectric material 84 over shield electrodes 82, and gate electrodes 88B are formed over shield electrodes 82A and over the portions of dielectric material 84 that are formed over shield electrodes 82A. Silicide layers 90 are formed from gate electrodes 88A and 88B.

A layer of dielectric material 91 is formed over silicide layers 90 and over the exposed portions of dielectric layer 85. Contact openings are formed in dielectric material 91 to expose portions of silicide layers 90 and electrical contacts 98 and 100 are formed in the contact openings. Contacts 98 and 100 contact silicide layers 90. A metal layer 101 is formed to contact electrical contacts 98 and 100 and serves as a metal gate feed. Metal gate feed 101 is also referred to as a gate metal or a gate runner. Semiconductor component 10 includes a drain contact structure 108 that is made up of a doped region 110, a doped region 112, an electrical contact 116, and a drain metallization system 118. Drain metallization system 118 may also be referred to as a drain metal 118. In accordance with another embodiment, a doped region 112 is coupled to doped region 110 through a silicide layer 114. A layer of dielectric material (not shown) may be formed on the exposed portions of dielectric layer 91, on metal gate feed 101, and on drain metallization system 118.

Figure 4:
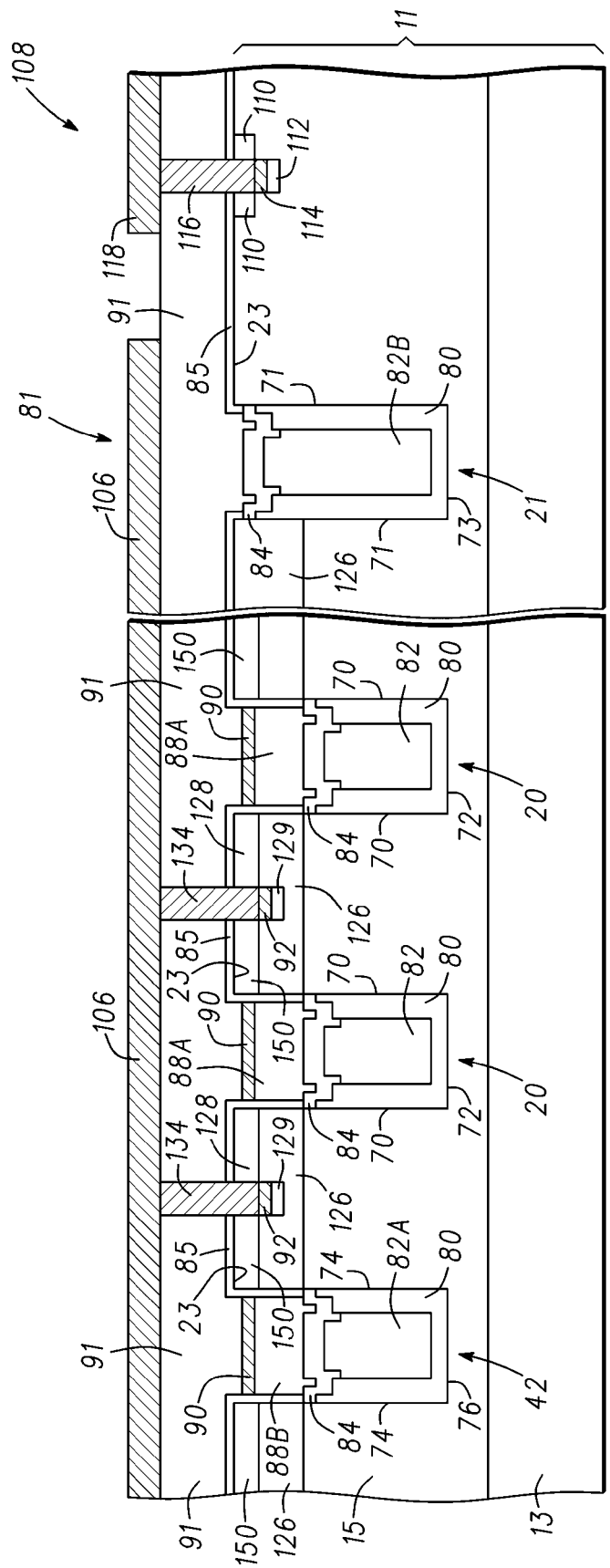
FIG. 4 is cross-sectional view of a portion of the semiconductor component of FIG. 2 taken along the region of section line 4-4 of FIG. 2 but at a later stage of manufacture.

FIG. 4 is a cross-sectional view of semiconductor component 10 taken along section line 4-4 of FIG. 2. What is shown in FIG. 4 is doped or body regions 126, body enhancement regions 129, source regions 150, silicide layers 90 and 92, source contacts 134, and source metallization system 106 during manufacture. Source metallization system 106 may be referred to as a source metal 106 or source metal layer 106. In addition, FIG. 4 illustrates drain contact structure 108 that is made up of a doped region 110, a doped region 112, an electrical contact 116, and a drain metallization system 118.

Figure 5:
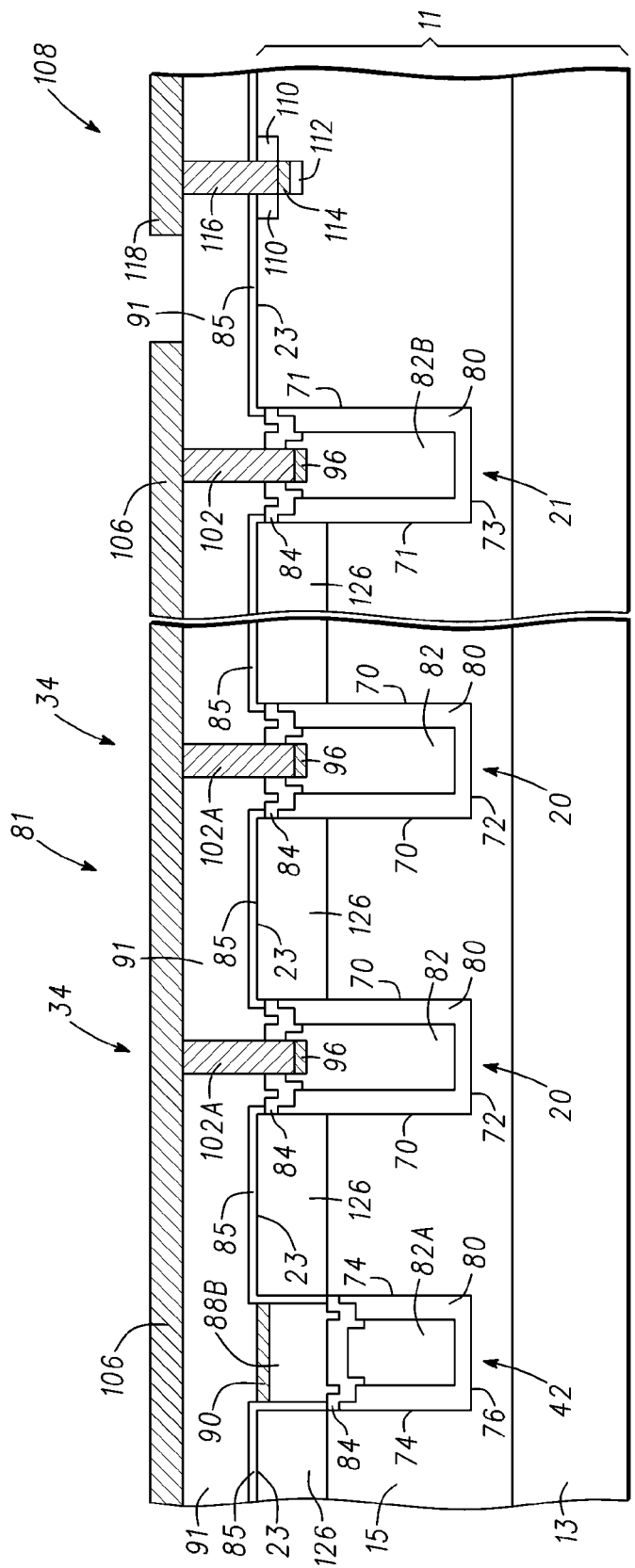
FIG. 5 is cross-sectional view of a portion of the semiconductor component of FIG. 2 taken along the region of section line 5-5 of FIG. 2 but at a later stage of manufacture.

FIG. 5 is a cross-sectional view of semiconductor component 10 taken along section line 5-5 of FIG. 2. What is shown in FIG. 5 are central shield contact portions 34 during manufacture. Central shield contact portions 34 include electrical contacts 102A in contact with shield electrodes 82, electrical contacts 102 in contact with shield electrodes 82B, and source metal 106 in contact with electrical contacts 102 and 102A. It should be noted that the character "A" has been appended to reference characters 102 to distinguish the electrical contacts of central shield contact portions 34 from the electrical contacts of peripheral shield contact portions 44 and 46.

Figure 6:
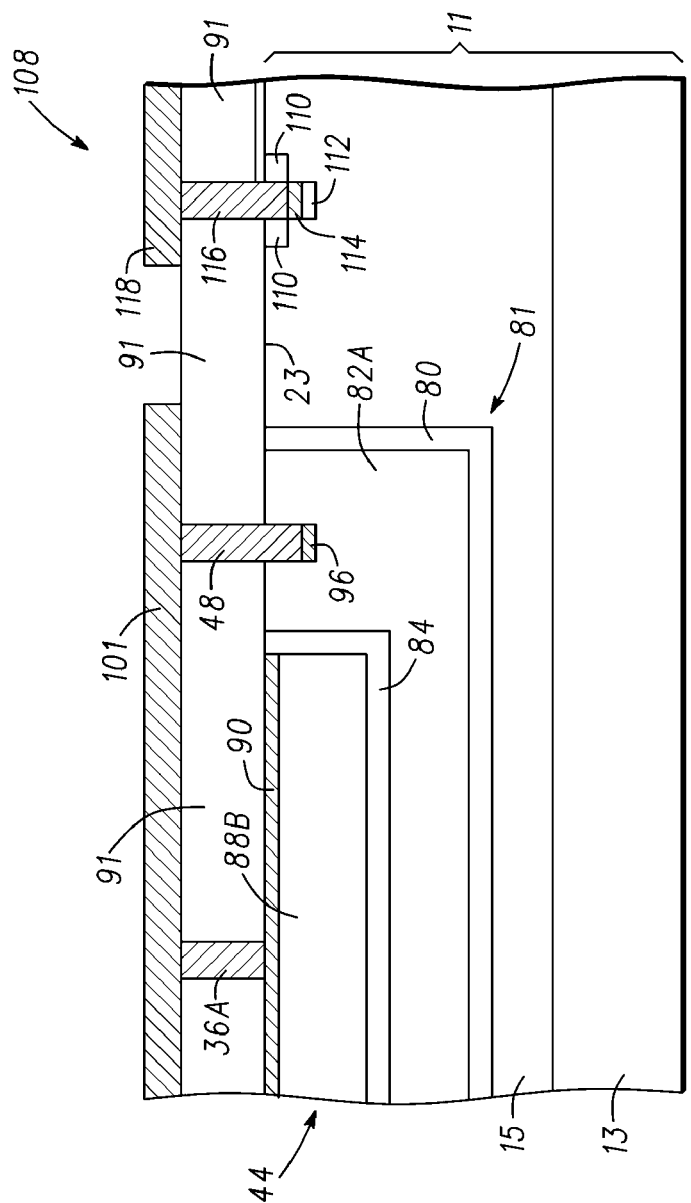
FIG. 6 is a cross-sectional view of the semiconductor component of FIG. 2 taken along section line 6-6 of FIG. 2, but at a later stage of manufacture.

FIG. 6 is a cross-section view of semiconductor component 10 taken along section line 6-6 of FIG. 2. What is shown in FIG. 6 is contact portion 44 having a gate interconnect 36A coupled to polysilicon portion 88B through silicide layer 90 and peripheral shield contact 48 coupled to polysilicon portion 82A. Gate interconnect 36A is electrically coupled to peripheral shield contact 48 through metal gate feed 101. It should be noted that the shield and gate electrodes may be referred to as electrical conductors and when the electrically conductive material of the shield and gate electrodes is polysilicon, the shield and gate electrodes may be referred to as polysilicon structures, polysilicon electrodes, or the like.

Figure 7:
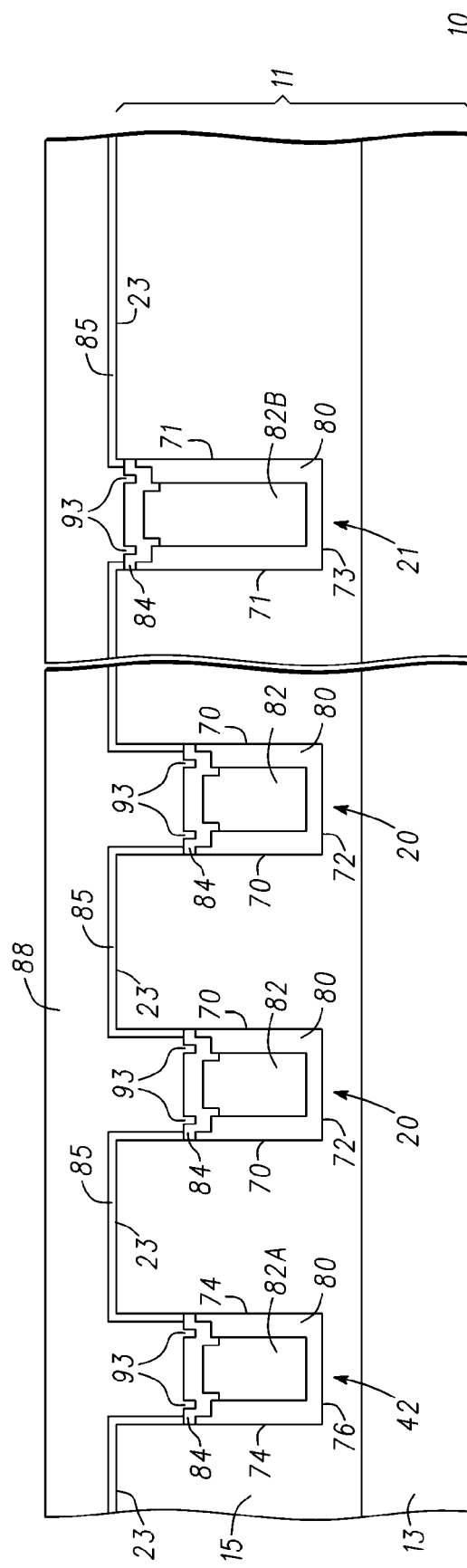
FIG. 7 is a cross-sectional view of the semiconductor component of FIG. 4 at an earlier stage of manufacture.

FIG. 7 is a cross-sectional view of the portion of semiconductor component 10 from FIG. 4, but at an earlier stage of manufacture. Portions 82 of shield electrode 81 have been formed in trenches 20, portions 82A of shield electrode 81 have been formed in trenches 42, and portions 82B of shield electrode 81 has been formed in trench 21. For the sake of clarity, portions 82, 82A, and 82B of shield electrode 82 are referred to as shield electrodes. A layer of dielectric material 85 such as, for example, oxide, having a thickness ranging from about 250 Å to about 750 Å is formed from or on surface 23, from or on the exposed portions of sidewalls 70, 71, and 74, and from or on the remaining portions of dielectric layer 84. By way of example, dielectric layer 85 has a thickness of about 450 Å. The portions of dielectric material 85 along sidewalls 70 and 74 serve as a gate dielectric material. It should be noted that in the regions of oxide stubs 93, gate oxide 85 is grown through oxide stubs 93.

A layer of polysilicon 88 having a thickness ranging from about 3,500 Å to about 6,000 Å is formed on dielectric layer 85 and preferably fills trenches 20, 21, and 42. When the conductivity type of epitaxial layer 15 is N-type, the conductivity type of polysilicon layer 88 is preferably N-type. Polysilicon layer 88 is annealed so that it is substantially free of voids. By way of example, polysilicon layer 88 is doped with phosphorus, has a thickness of about 5,000 Å, and is annealed at a temperature of about 900° C. for about 60 minutes. Polysilicon layer 88 is treated with a buffered hydrofluoric acid dip to remove any oxide that may have formed on its surface.

Figure 8:
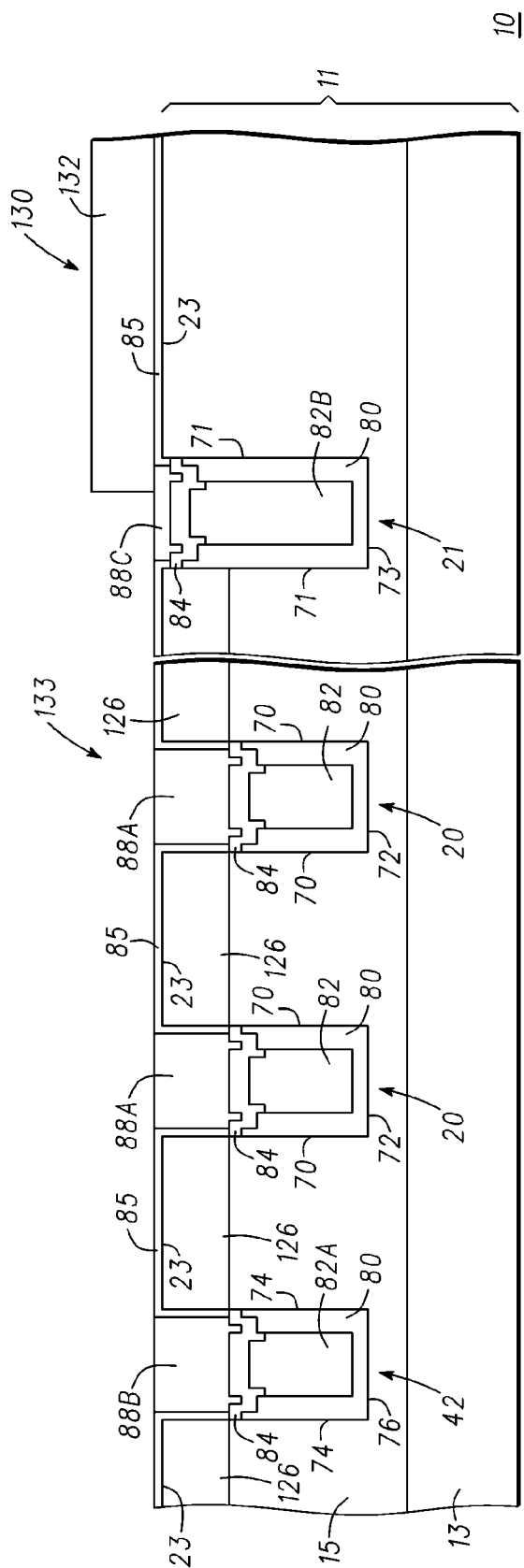
FIG. 8 is a cross-sectional view of the semiconductor component of FIG. 7 at a later stage of manufacture.

FIG. 8 is a cross-sectional view of semiconductor component 10 from FIG. 7, but at a later stage of manufacture.

Polysilicon layer 88 is planarized using, for example, a chemical mechanical planarization ("CMP") process that is selective for the material of dielectric layer 85, i.e., dielectric layer 85 serves as an etch stop for the CMP process. Planarization of polysilicon layer 88 leaves portions 88A in trenches 20, portions 88B in trenches 42, and portion 88C in trench 21. The method for planarizing polysilicon layer 88 is not a limitation of the present invention. Other suitable planarization techniques include wet etching techniques, dry etching techniques, combinations of wet and dry etching techniques, or the like. A layer of photoresist is patterned over portions 88A, 88B, and 88C of polysilicon layer 88 and over portions of dielectric layer 85. More particularly, the photoresist layer is patterned to form a masking structure 130 having a masking element 132 that protects a sub-portion of portion 88C in trench 21 and an opening 133 that exposes portions of dielectric layer 85 and portions 88A and 88B of polysilicon layer 88. Masking structure 130 is also referred to as a mask or an implant mask.

An impurity material of, for example, P-type conductivity is implanted into the portions of epitaxial layer 15 that are laterally adjacent to trenches 20, 21, and 42, i.e., the portions of epitaxial layer 15 that are unprotected by masking element 132. The implant forms doped regions 126 which serve as a P-type body implant. The impurity material is also implanted into portions 88A, 88B, and 88C of polysilicon layer 88. Suitable dopants for the P-type implant include boron, indium, or the like. Masking structure 130 is removed and doped regions 126 are annealed. Although FIG. 7 has been described as a continuation of the structure shown in FIG. 4, it should be noted that it may also be a continuation of the structure shown in FIG. 3.

Figure 9:
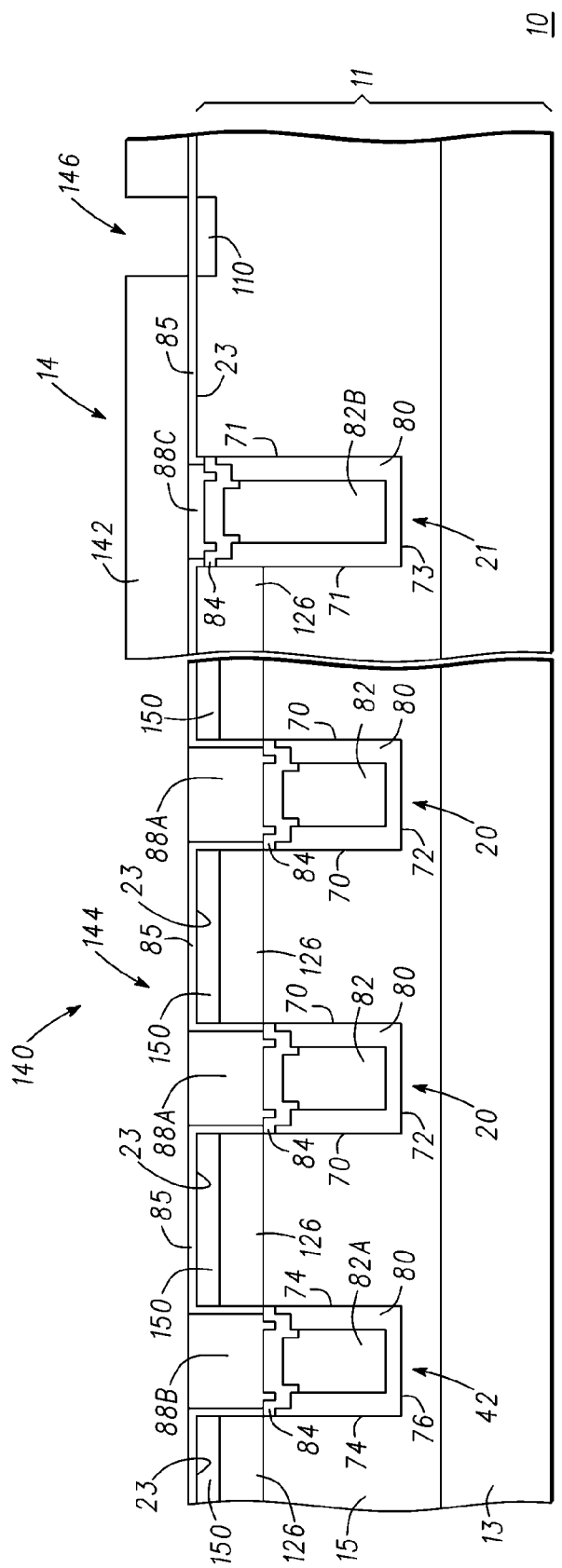
FIG. 9 is a cross-sectional view of the semiconductor component of FIG. 8 at a later stage of manufacture.
Figure 10:
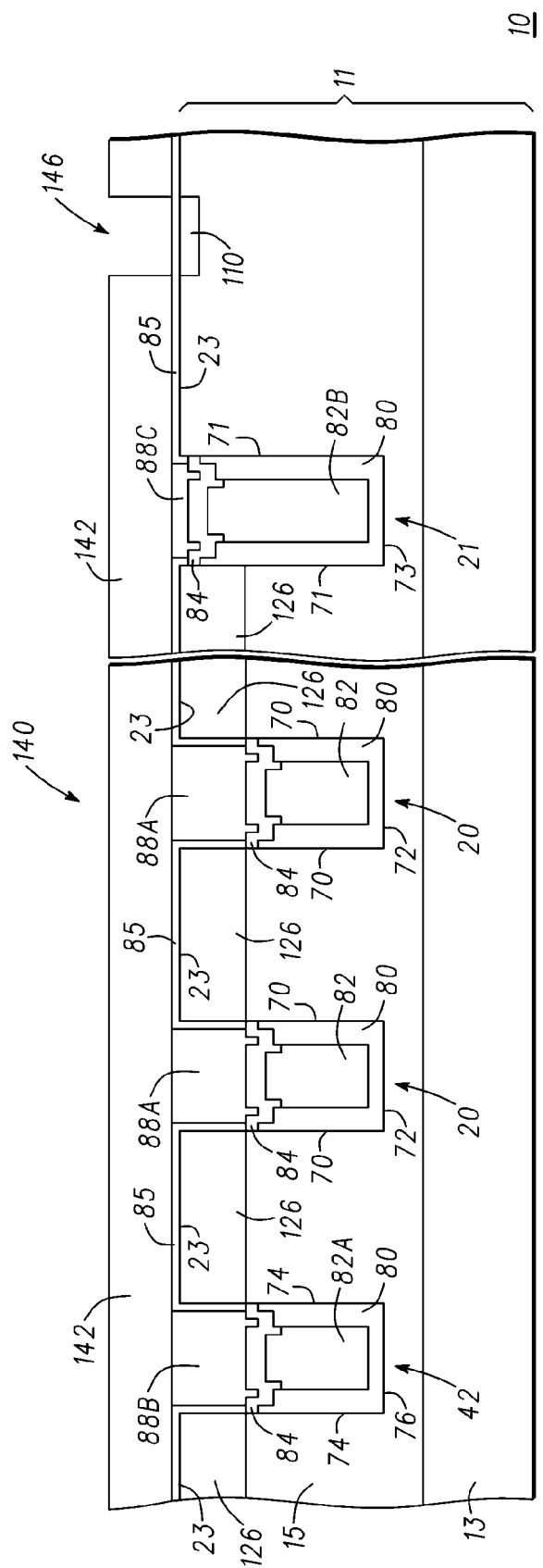
FIG. 10 is a cross-sectional view of the semiconductor component of FIG. 3 at a later stage of manufacture.
Figure 11:
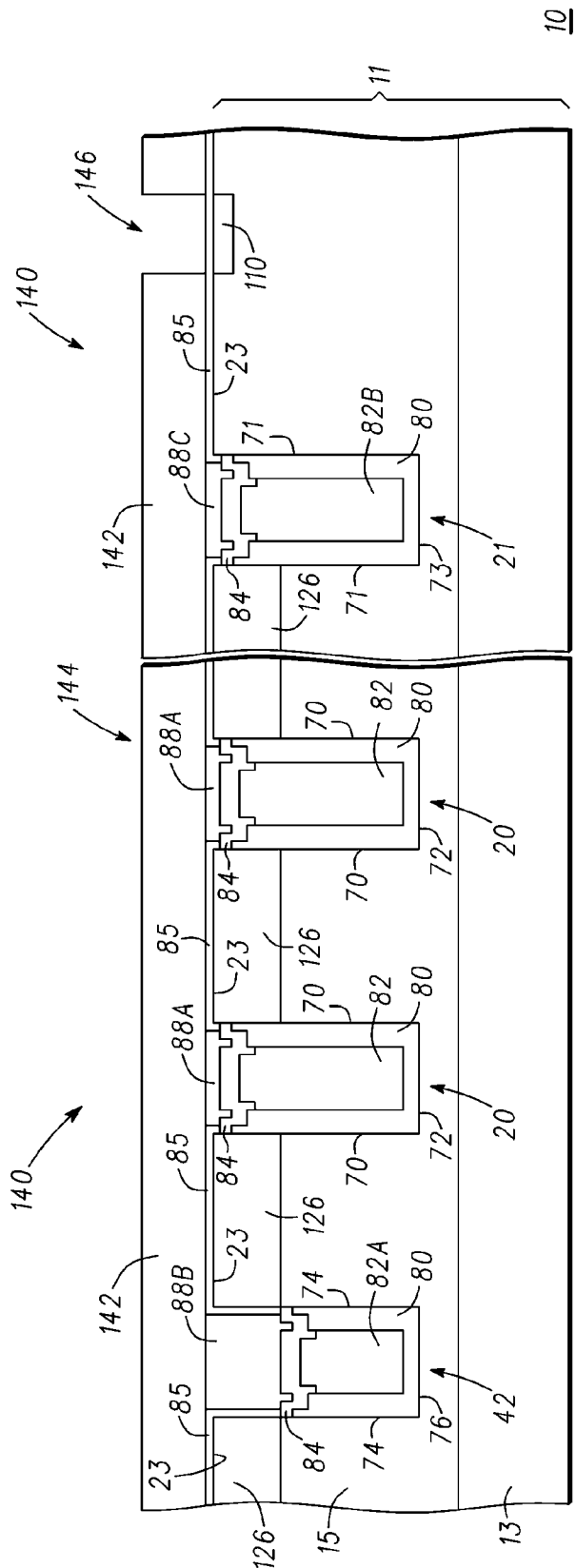
FIG. 11 is a cross-sectional view of the semiconductor component of FIG. 5 at a later stage of manufacture.

Referring now to FIGS. 9-11, a layer of photoresist is patterned over polysilicon portions 88A and 88B and dielectric layer 85 to form a masking structure 140 having masking elements 142 and openings 144 and 146. Masking elements 142 protect shield electrode 82B, portions of gate electrodes 88A and 88B, trench 21, and termination region 14. Opening 144 exposes portions of gate electrodes 88A and 88B and body region 126 that are in the active or device region, i.e., the portions of gate electrodes 88A and 88B shown in FIG. 9. Polysilicon portions 88A and 88B are referred to as gate electrodes. Opening 146 exposes a portion of dielectric layer 85 over epitaxial layer 15. It should be noted that FIGS. 9-11 are cross-sections taken at substantially the same time during the manufacture of semiconductor component 10, but at different locations. More particularly, FIG. 9 is a cross-sectional view that continues from the cross-sectional view shown in FIG. 8; FIG. 10 is a cross-sectional view that continues from the cross-sectional view shown in FIG. 3; and FIG. 11 is a cross-sectional view that continues from the cross-sectional view shown in FIG. 5. Masking structure 140 is also referred to as a mask or an implant mask. An impurity material of N-type conductivity is implanted into the portions of epitaxial layer 15 that are laterally adjacent to trenches 20, i.e., the portions of epitaxial layer 15 that contain doped regions 126 and that are unprotected by masking element 142. The implant forms doped regions 150 which serve as source regions for semiconductor component 10 and a doped region 110 that serves as a drain contact implant to preclude inversion of surface charge. Doped region 110 is also referred to as a drain ring. Masking structure 140 is removed and doped regions 110 and 150 are annealed.

Figure 12:
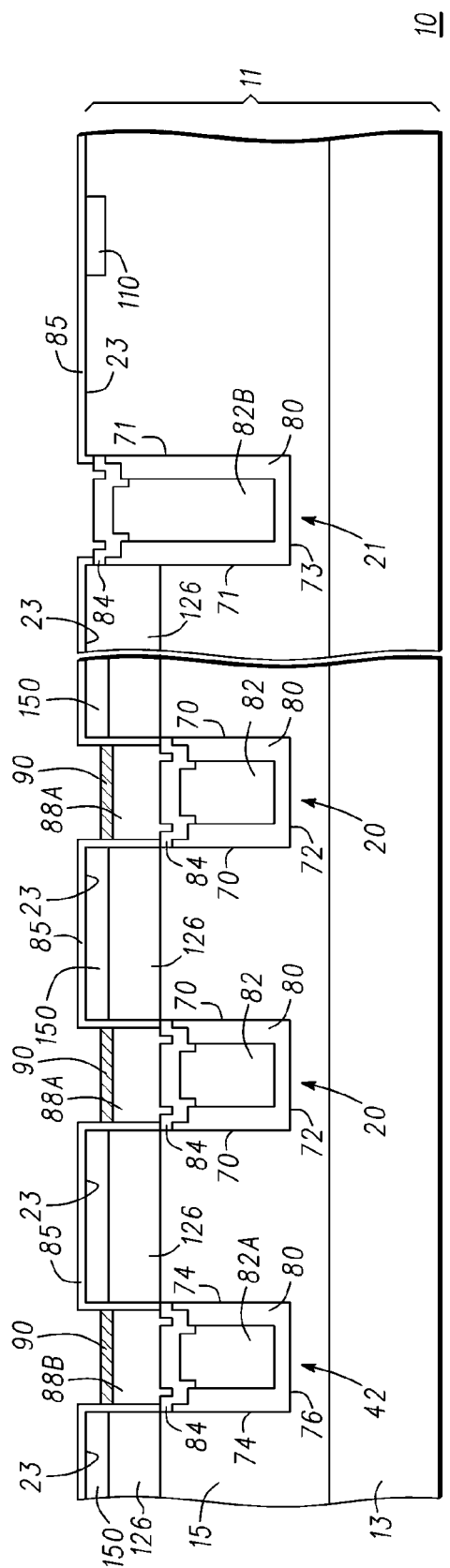
FIG. 12 is a cross-sectional view of the semiconductor component of FIG. 9 at a later stage of manufacture.
Figure 13:
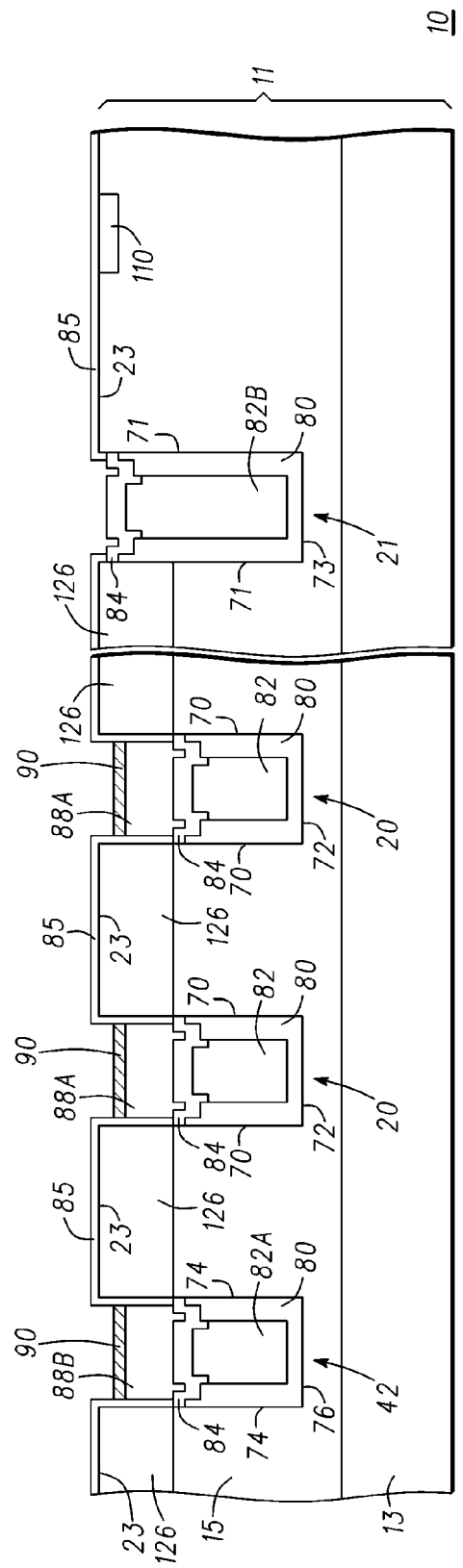
FIG. 13 is a cross-sectional view of the semiconductor component of FIG. 10 at a later stage of manufacture.

Referring now to FIGS. 12 and 13, polysilicon portions 88A and 88B, i.e., the remaining portions of polysilicon layer 88 that are in trenches 20 and 42, respectively, are recessed so that they are below surface 23. Preferably, polysilicon portion 88C is substantially completely removed from trench 21. By way of example, polysilicon portions 88A, 88B, and 88C are recessed or removed using an isotropic etch technique that is fast and selective to dielectric layer 85, i.e., an isotropic etch that etches polysilicon and stops on dielectric layer 85. By way of example, the isotropic etch recesses polysilicon portions 88A and 88B so that they are about 1,500 Å below surface 23. Portions 88A and 88B are referred to as gate electrodes and are connected together in the layout. It should be noted that FIGS. 12 and 13 are cross-sections taken at substantially the same time during the manufacture of semiconductor component 10, but at different locations. More particularly, FIG. 12 is a cross-sectional view that continues from the cross-sectional view shown in FIG. 9 and FIG. 13 is a cross-sectional view that continues from the cross-sectional view shown in FIG. 10.

Polysilicon portions 88A and 88B and the exposed portions of dielectric layer 85 are cleaned using a dilute or buffered hydrofluoric acid solution. In accordance with one example, the clean removes about 35 Å from dielectric layer 85 and removes substantially all oxide formed on the top surfaces of polysilicon portions 88A and 88B. A layer of refractory metal (not shown) is conformally deposited over gate electrodes 88A, gate contact electrode 88B, and on dielectric layer 85. Preferably, the refractory metal is cobalt having a thickness ranging from about 100 Å to about 1,000 Å. The cobalt that is in contact with polysilicon or silicon is converted to cobalt silicide using a rapid thermal anneal technique. For example, the refractory metal is heated to a temperature ranging from about 350° C. to about 850° C. The heat treatment causes the cobalt to react with the silicon to form cobalt silicide in all regions in which the cobalt contacts polysilicon or silicon. Thus, cobalt silicide layers 90 are formed from gate electrodes 88A and cobalt silicide layers 90 are formed from gate contact electrodes 88B. The portions of the cobalt over dielectric layer 85 remain unreacted. After the formation of the cobalt silicide layers 90, any unreacted cobalt is removed using, for example, a selective wet etch. After removal of the unreacted cobalt, the cobalt silicide is annealed again using, for example, a rapid thermal anneal process. It should be understood that the type of silicide is not a limitation of the present invention. For example, other suitable silicides include nickel silicide, platinum silicide, titanium silicide, or the like.

Figure 14:
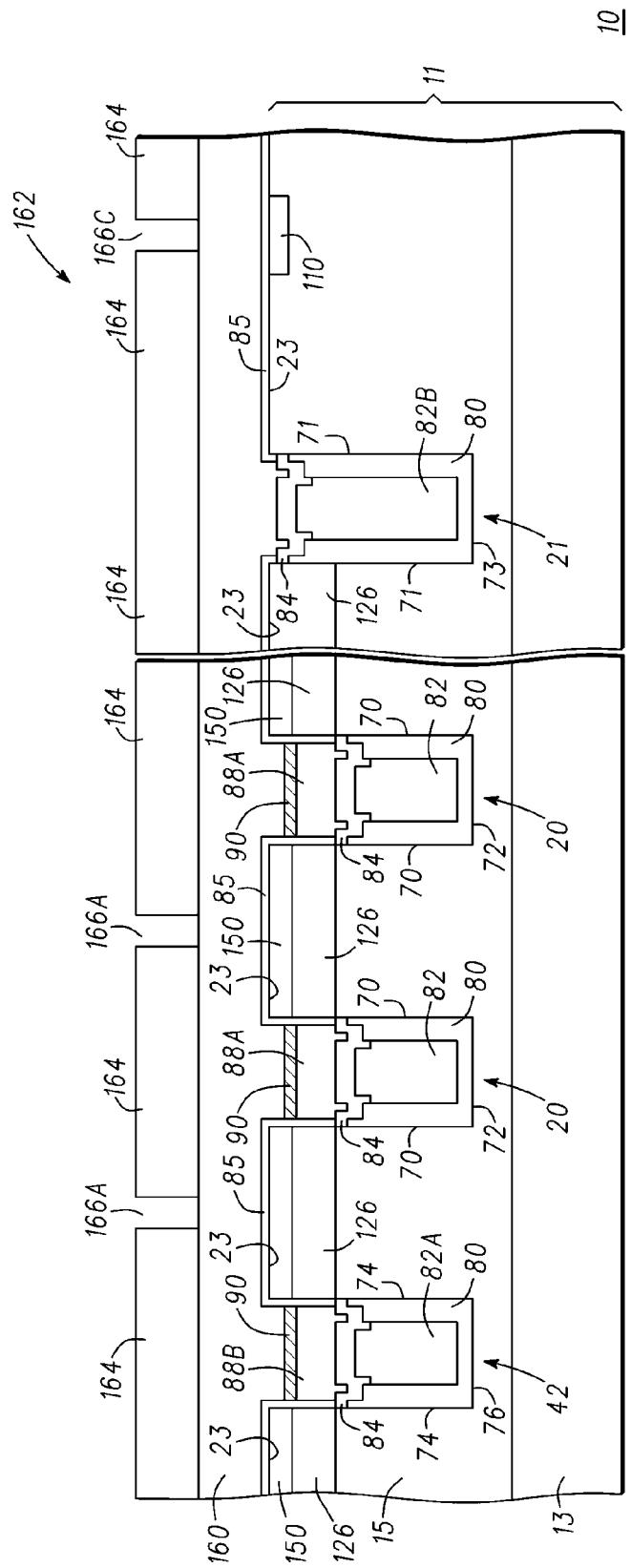
FIG. 14 is a cross-sectional view of the semiconductor component of FIG. 12 at a later stage of manufacture.
Figure 15:
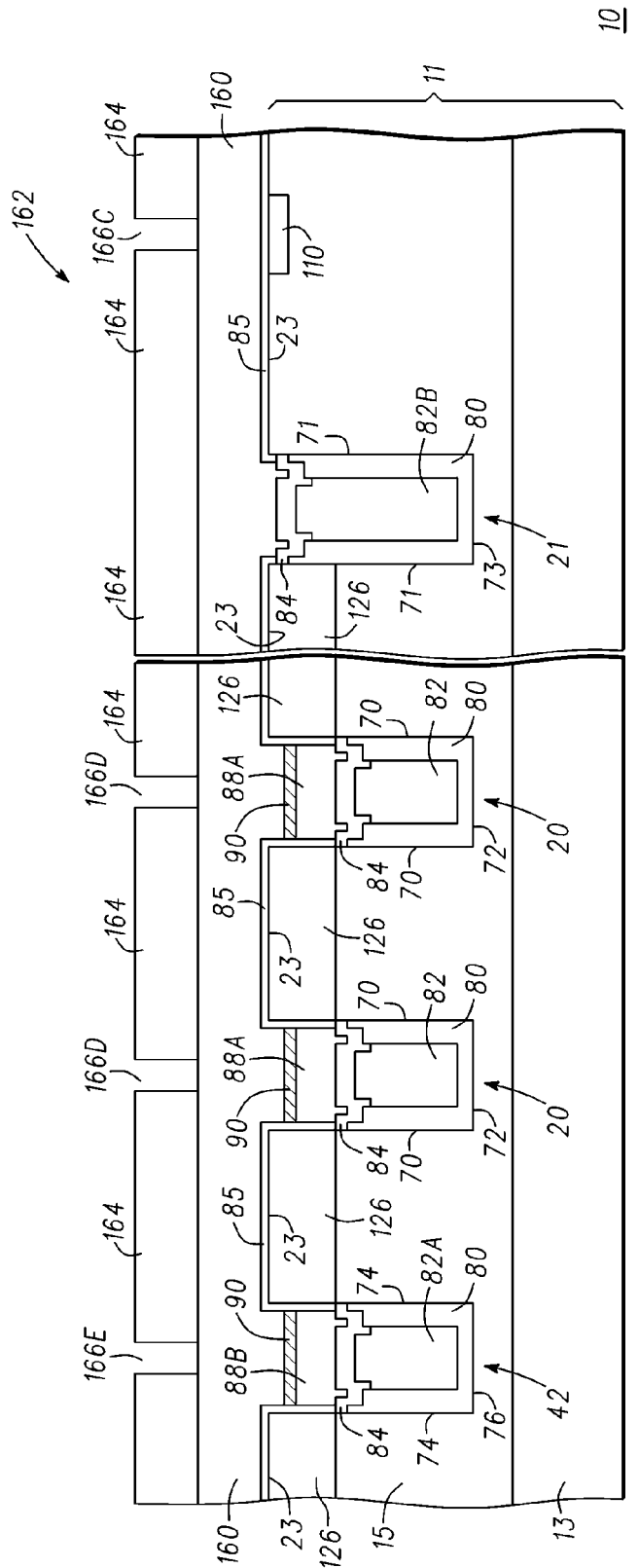
FIG. 15 is a cross-sectional view of the semiconductor component of FIG. 13 at a later stage of manufacture.
Figure 16:
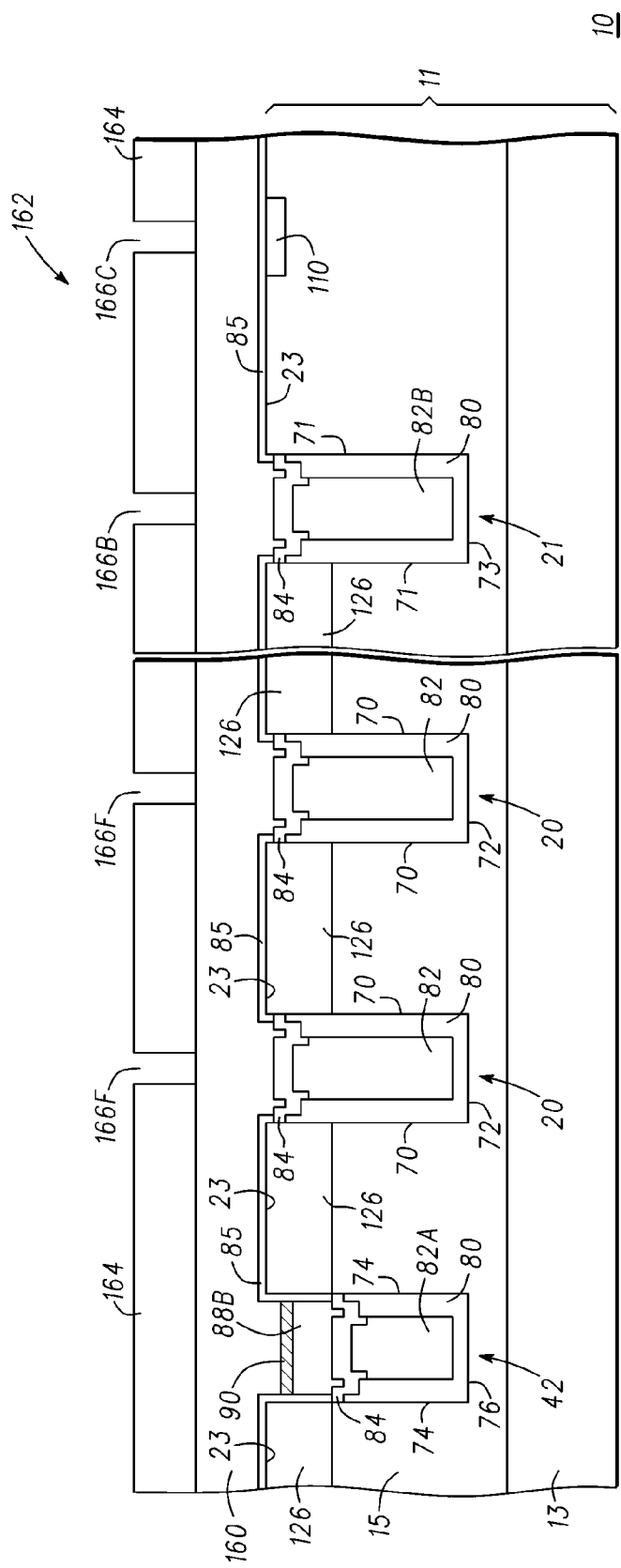
FIG. 16 is a cross-sectional view of the semiconductor component of FIG. 11 at a later stage of manufacture.

Referring now to FIGS. 14-16, a layer of dielectric material 160 having a thickness ranging from about 3,000 Å to about 12,000 Å is formed on silicide layers 90 and on dielectric layer 85. It should be noted that FIGS. 14-16 are cross-sectional views taken at substantially the same time during the manufacture of semiconductor component 10, but at different locations. More particularly, FIG. 14 is a cross-sectional view that continues from the cross-sectional view shown in FIG. 12; FIG. 15 is a cross-sectional view that continues from the cross-sectional view shown in FIG. 13; and FIG. 16 is a cross-sectional view that continues from the cross-sectional view shown in FIG. 11. Dielectric layer 160 may be comprised of a single layer of dielectric material or a dielectric material comprised of a plurality of sub-layers. In accordance with an embodiment of the present invention, dielectric layer 160 is a multi-layer dielectric material comprising a phosphorus doped layer formed by atmospheric pressure chemical vapor deposition ("APCVD") and a silane based oxide layer formed by plasma enhanced chemical vapor deposition ("PECVD"). Preferably the phosphorus doped layer is formed on silicide layers 90 and dielectric layer 85 and has a thickness of about 4,500 Å and the silane based oxide layer is formed on the phosphorus doped layer and has a thickness of about 4,800 Å. Dielectric layer 160 is planarized using, for example, a CMP process. After planarization, dielectric layer 160 preferably has a thickness of about 7,000 Å. Alternately, dielectric layer 160 may be a layer of borophosphosilicate glass ("BPSG") which can be reflowed by heating.

Still referring to FIGS. 14-16, a layer of photoresist is patterned over dielectric layer 160 to form a masking structure 162 having masking elements 164 and openings 166A, 166B, 166C, 166D, 166E, and 166F that expose portions of dielectric layer 160. Masking structure 162 is also referred to as a mask or an etch mask.

Figure 17:
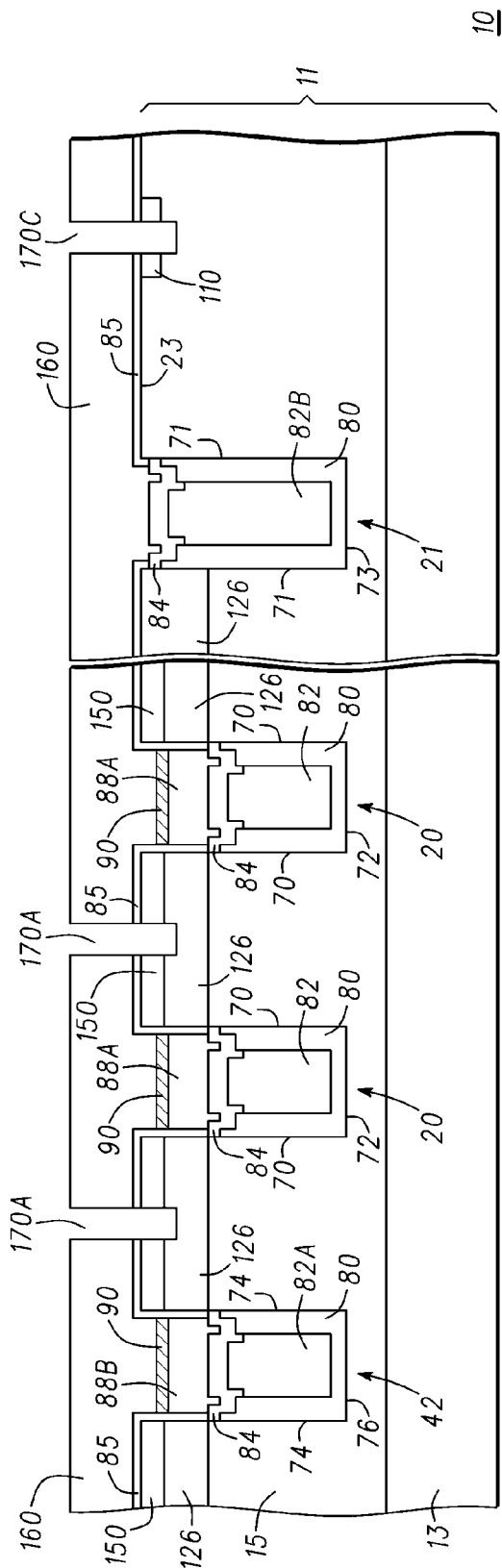
FIG. 17 is a cross-sectional view of the semiconductor component of FIG. 14 at a later stage of manufacture.
Figure 18:
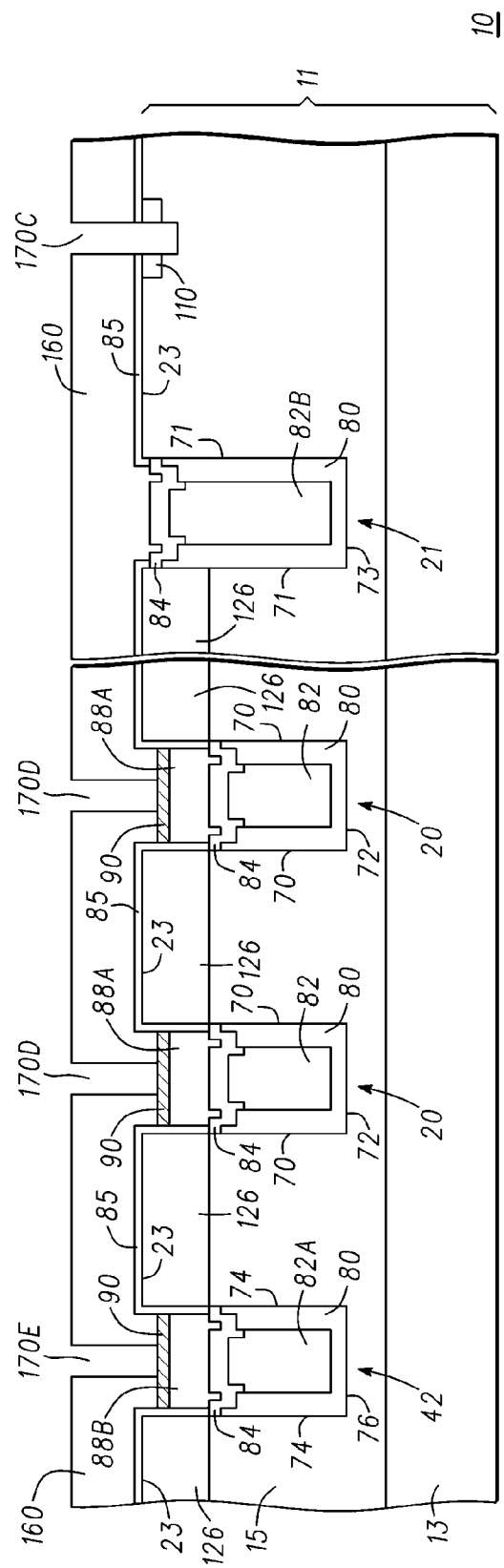
FIG. 18 is a cross-sectional view of the semiconductor component of FIG. 15 at a later stage of manufacture.
Figure 19:
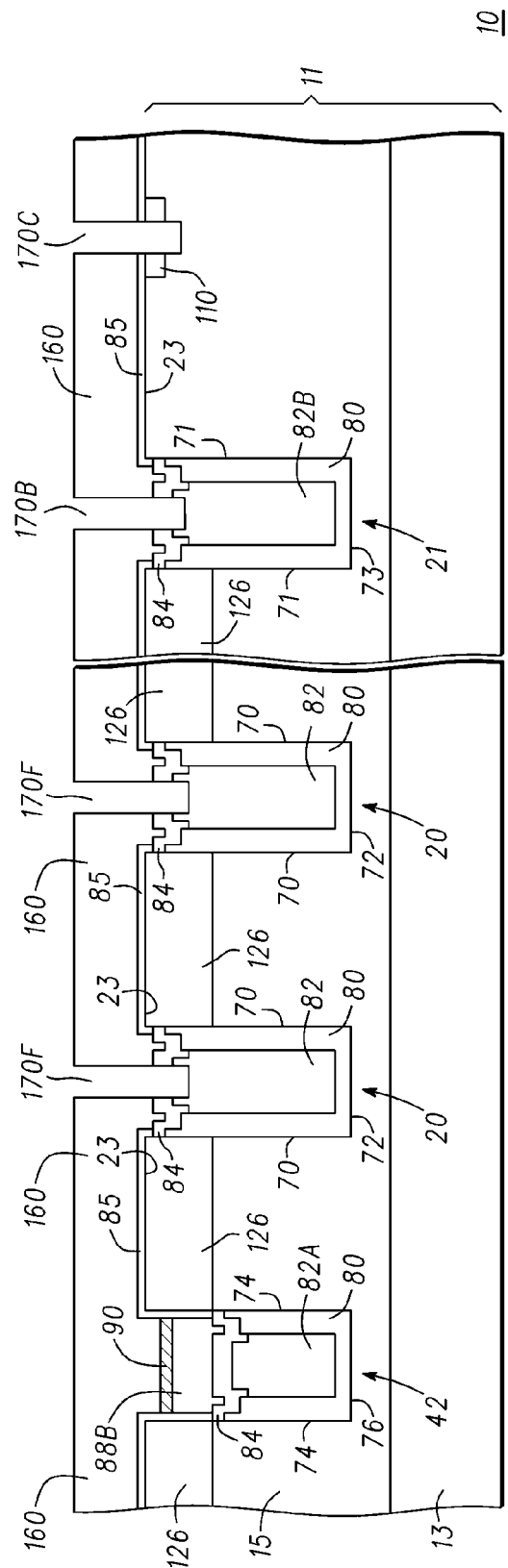
FIG. 19 is a cross-sectional view of the semiconductor component of FIG. 16 at a later stage of manufacture.

Referring now to FIGS. 17-19, the exposed portions of dielectric layer 160 are anisotropically etched using, for example, a reactive ion etch to form openings 170A, 170B, 170C, 170D, 170E, and 170F, where openings 170A expose portions of source region 150 and body region 126 that are adjacent to trench 20 and portions of doped region 150 that are between adjacent trenches 20; opening 170B exposes polysilicon portion 82B; openings 170D and 170E expose portions of silicide layers 90; opening 170C exposes a portion of epitaxial layer 15 including a portion of doped region 110; and openings 170F expose portions of shield electrodes 82. Preferably, the anisotropic etch that forms openings 170A-170F is selective to silicide layer 90, i.e., the etch stops on silicide layer 90. It should be noted that FIGS. 17-19 are cross-sectional views taken at substantially the same time during the manufacture of semiconductor component 10, but at different locations. More particularly, FIG. 17 is a cross-sectional view that continues from the cross-sectional view shown in FIG. 14; FIG. 18 is a cross-sectional view that continues from the cross-sectional view shown in FIG. 15; and FIG. 19 is a cross-sectional view that continues from the cross-sectional view shown in FIG. 16.

Openings 170A extend into body region 126, opening 170B extends into shield electrode 82B, opening 170C extends through doped region 110 into epitaxial layer 15, and openings 170F extend into shield electrodes 82, and serve as contact openings. The exposed portions of epitaxial layer 15 that contain doped regions 150, the exposed portion of epitaxial layer 15, and the exposed portions of shield electrodes 82 and 82B are recessed using, for example, a reactive ion etch. The etch forming the recesses may remove about 900 Å from dielectric material 160. The exposed portion of silicide layer 90, the exposed portions of epitaxial layer 15 that contain doped regions 150, the exposed portion of epitaxial layer 15, and the exposed portions of shield electrodes 82 and 82B are cleaned using a dilute or buffered hydrofluoric acid solution. Preferably, the clean removes substantially all oxide formed on the exposed portion of silicide layer 90, the exposed portions of epitaxial layer 15 that contain doped regions 150, the exposed portion of epitaxial layer 15, and the exposed portions of shield electrodes 82 and 82B.

Figure 20:
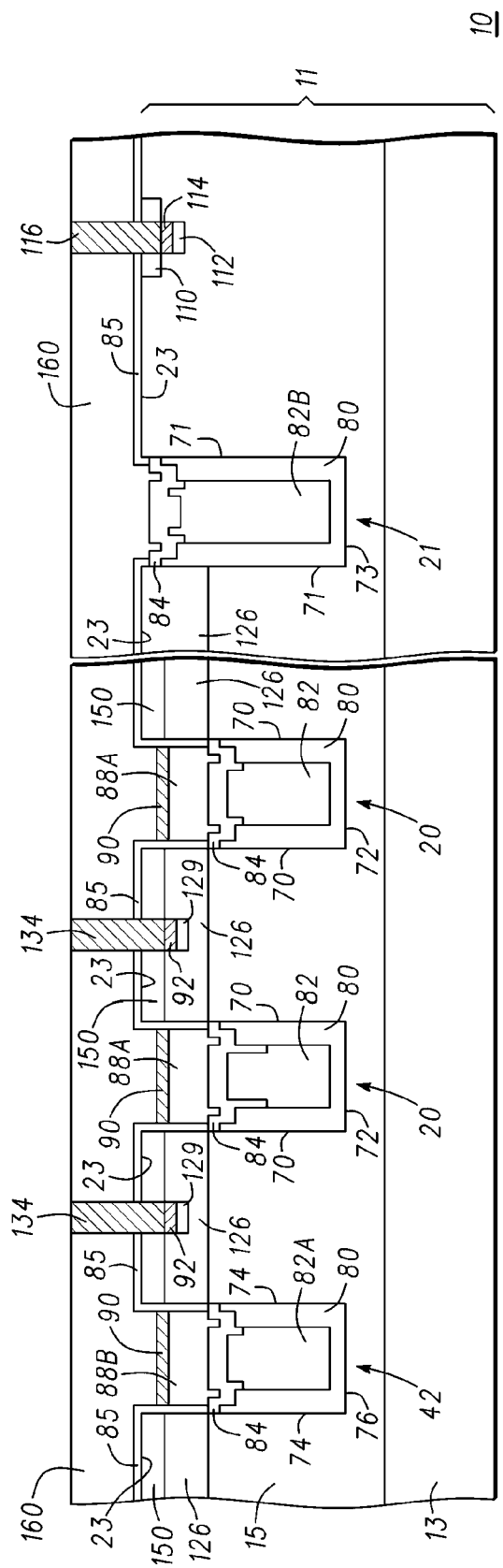
FIG. 20 is a cross-sectional view of the semiconductor component of FIG. 17 at a later stage of manufacture.
Figure 21:
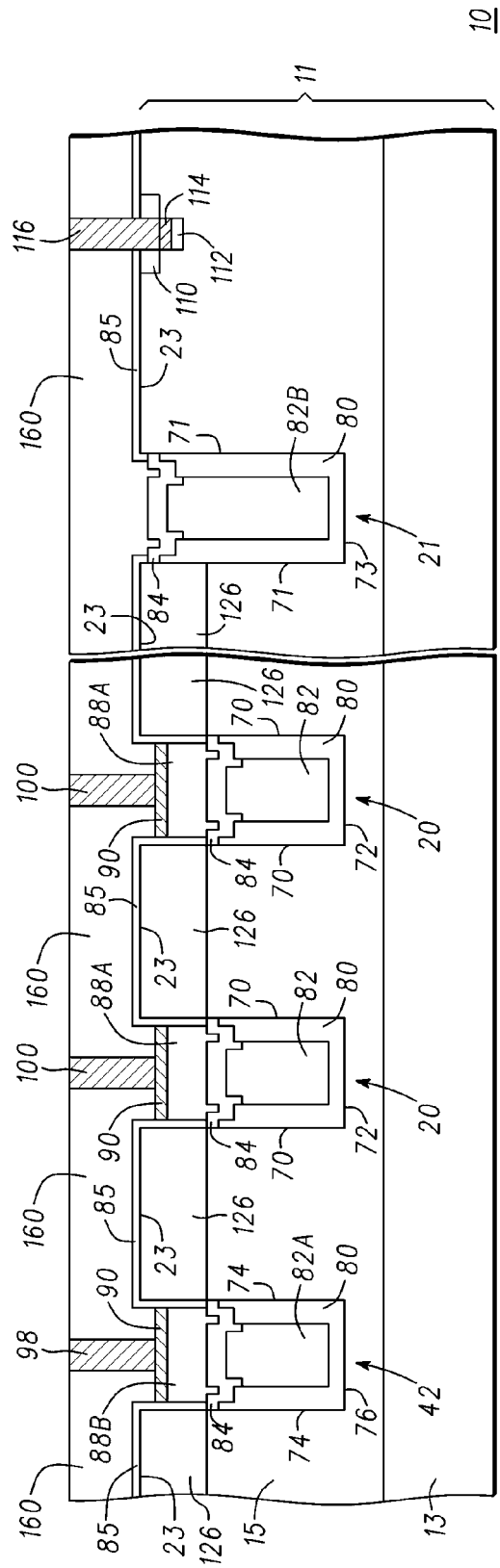
FIG. 21 is a cross-sectional view of the semiconductor component of FIG. 18 at a later stage of manufacture.
Figure 22:
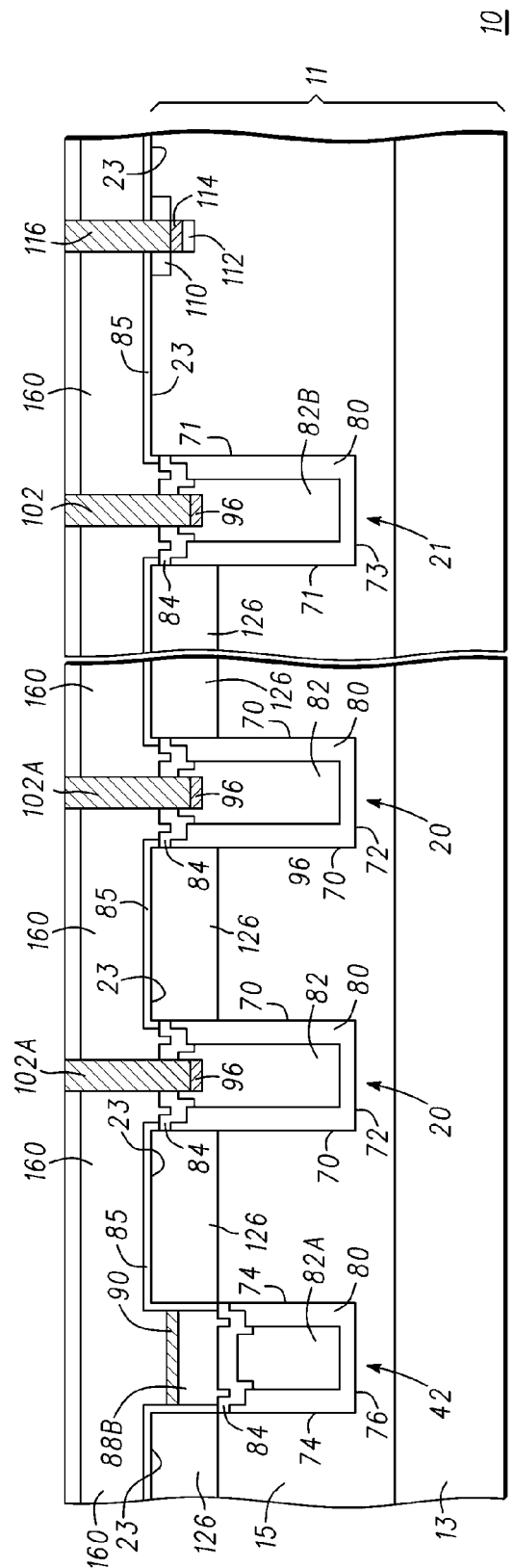
FIG. 22 is a cross-sectional view of the semiconductor component of FIG. 19 at a later stage of manufacture.

Referring now to FIGS. 20-22, optionally an impurity material of P-type conductivity is implanted into the exposed portions of epitaxial layer 15 that contain doped regions 126, the exposed portion of epitaxial layer 15, and the exposed portions of shield electrodes 82 and 82B. It should be noted that FIGS. 20-22 are cross-sections taken at substantially the same time during the manufacture of semiconductor component 10, but at different locations. More particularly, FIG. 20 is a cross-sectional view that continues from the cross-sectional view shown in FIG. 17; FIG. 21 is a cross-sectional view that continues from the cross-sectional view shown in FIG. 18; and FIG. 22 is a cross-sectional view that continues from the cross-sectional view shown in FIG. 19. The implant forms doped regions 129 in the portions of doped region 126 that are exposed by openings 170A (shown in FIG. 17) and doped region 112 in the portion of epitaxial layer 15 that is exposed by opening 170C (shown in FIGS. 17-19). Because polysilicon portions 82 and 82B are heavily doped with an impurity material of N-type conductivity, doped regions are not formed in polysilicon portions 82 and 82B by the implant that forms doped regions 112 and 129. Doped regions 112 and 129 are annealed and shield electrodes 82 and 82B are cleaned using, for example, a buffered hydrofluoric acid solution and then annealed.

Optionally, silicide layers 92 are formed in the portions of epitaxial layer 15 exposed by openings 170A, i.e., the exposed portions of doped regions 126 and 150; silicide layers 96 are formed in the portions of shield electrodes 82 and 82B exposed by openings 170B and 170C, and a silicide layer 114 is formed in the portion of epitaxial layer 15 exposed by opening 170C. By way of example, silicide layers 92, 96, and 114 are titanium silicide layers. Like silicide layers 90, the type of silicide formed in openings 170A, 170B, 170C, and 170F is not a limitation of the present invention. For example, other suitable silicides include nickel silicide, platinum silicide, cobalt silicide, or the like. Techniques for forming silicide layers are known to those skilled in the art. It should be noted that typically silicide forms on the portions of silicon or polysilicon exposed to the silicidation process. However, for the sake of clarity, silicide layers 92 and 114 have only been shown as being formed from the portions of the exposed silicon at the bottoms of openings 170A, 170B, 170C and 170F.

Preferably, a barrier layer (not shown) is formed in openings 170A-170F. Suitable materials for the barrier layer include titanium nitride, titanium tungsten, or the like. A conductive layer (not shown) such as, for example, tungsten is deposited to fill openings 170A, 170B, 170C, 170D, 170E, and 170F. This conductive layer is planarized using, for example, a CMP process to form contacts 134, 102, 116, 100, 98, and 102A in openings 170A, 170B, 170C, 170D, 170E, and 170F, respectively. Contacts 134, 102, 116, 100, 98, and 102A may also be referred to as conductive plugs. The method for planarizing the conductive layer is not a limitation of the present invention. Other suitable planarization techniques include wet etching techniques, dry etching techniques, combinations of wet and dry etching techniques, or the like.

Figure 23:
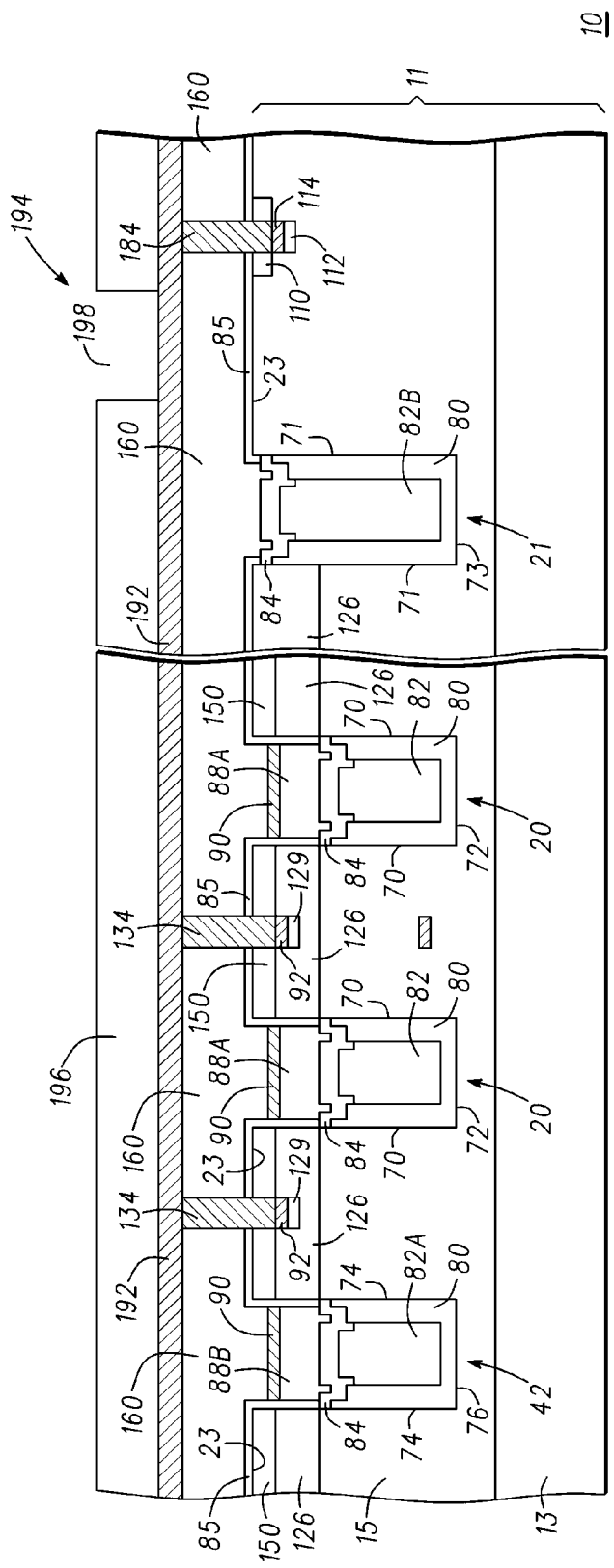
FIG. 23 is a cross-sectional view of the semiconductor component of FIG. 20 at a later stage of manufacture.
Figure 24:
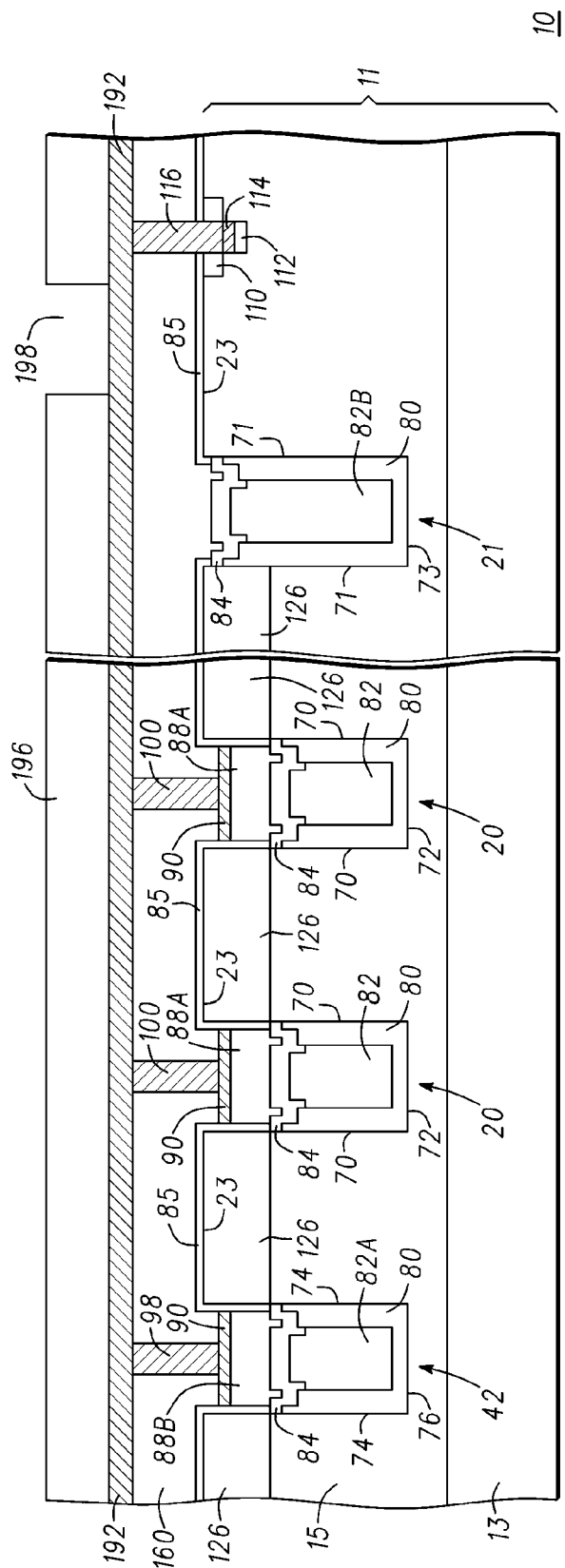
FIG. 24 is a cross-sectional view of the semiconductor component of FIG. 21 at a later stage of manufacture.
Figure 25:
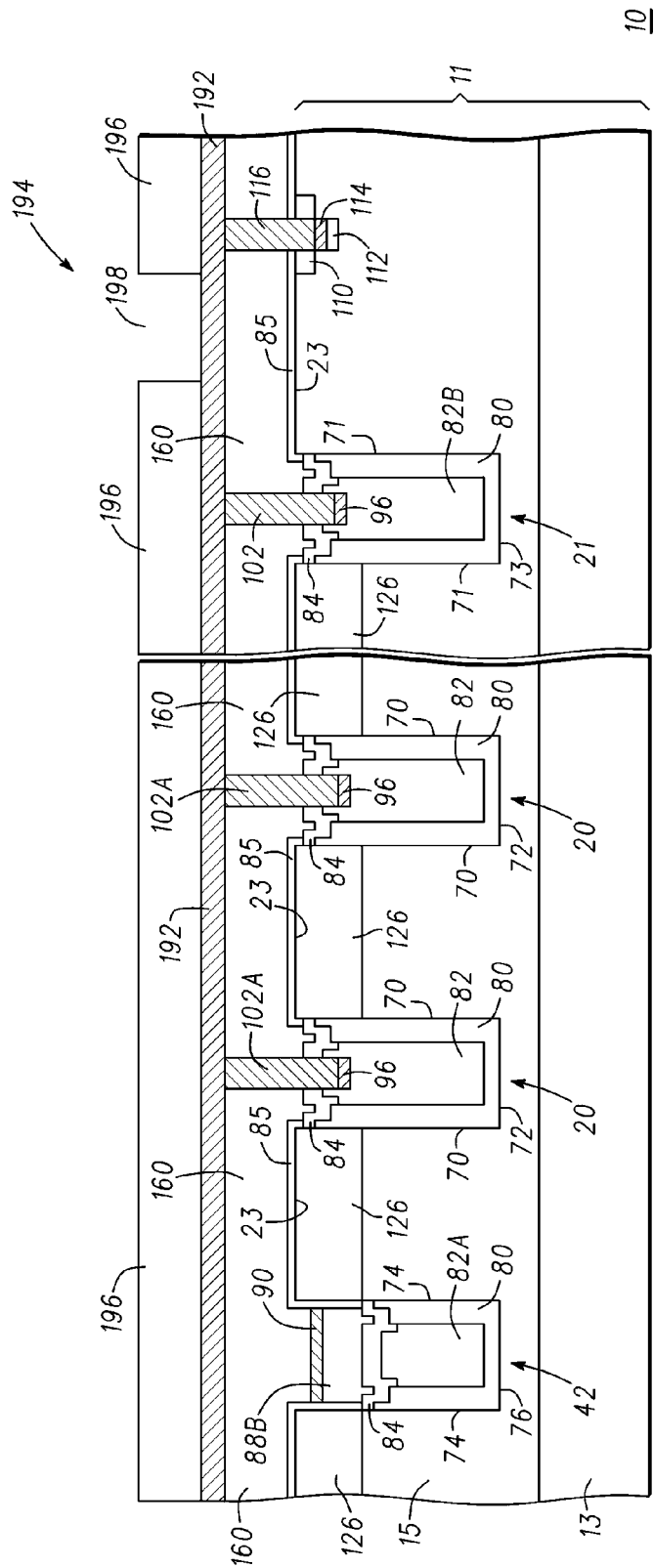
FIG. 25 is a cross-sectional view of the semiconductor component of FIG. 22 at a later stage of manufacture.

Referring now to FIGS. 23-25, a metallization system 192 such as, for example, an aluminum-copper (AlCu) metallization system, is formed in contact with contacts 134, 102, 116, 100, 98, and 102A. It should be noted that FIGS. 23-25 are cross-sections taken at substantially the same time during the manufacture of semiconductor component 10, but at different locations. More particularly, FIG. 23 is a cross-sectional view that continues from the cross-sectional view shown in FIG. 20; FIG. 24 is a cross-sectional view that continues from the cross-sectional view shown in FIG. 21; and FIG. 25 is a cross-sectional view that continues from the cross-sectional view shown in FIG. 22. A layer of photoresist is patterned over metallization system 192 to form a masking structure 194 having masking elements 196 and openings 198 that expose portions of metallization system 192. Masking structure 194 is also referred to as a mask or an etch mask.

Referring again to FIGS. 3-5, the exposed portions of metallization system 192 (shown in FIGS. 23-25) are etched to form a gate conductor 101 in contact with electrical contacts 98 and 100, a source conductor 106 in contact with electrical contacts 134, 102, and 102A, and a top side drain conductor 118 in contact with electrical contacts 116. Masking structure 194 is removed. A passivation layer (not shown) may be formed over conductors 101 and 118 and over dielectric material 91.

Figure 26:
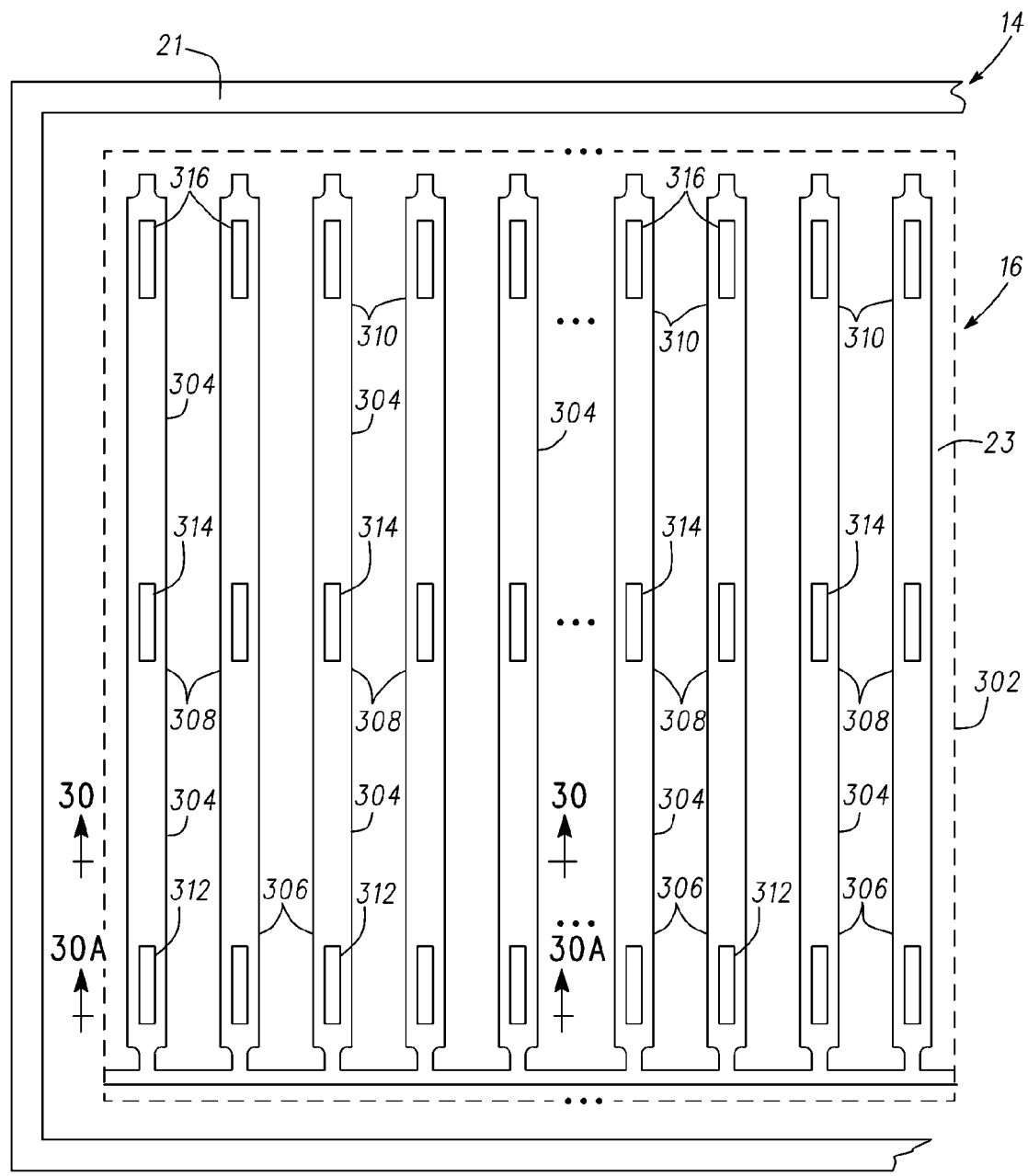
FIG. 26 is a plan view of a semiconductor component during manufacture in accordance with another embodiment of the present invention.

FIG. 26 is an enlarged plan view of a semiconductor component 300 in accordance with another embodiment of the present invention. What is shown in FIG. 26 is a portion of a semiconductor die or semiconductor chip 12 in which a gate bond pad 302 is formed. Gate bond pad 302 is shown by broken lines. A peripheral shield electrode trench 21 is formed in edge region 14 and around active area 16. A plurality of trenches 304 are formed in semiconductor material 11 of semiconductor chip 12. Trenches 304 have gate contact portions 306, 308, and 310. Although trenches 304 are shown as having a substantially uniform width, it should be noted that gate contact portions 306, 308, and 310 of trenches 304 may be wider than the portions of trenches 304 between gate contact portions 306 and 308 and they may be wider than the portions of trenches 304 between gate contact portions 308 and 310 to allow for the formation of gate contacts 312, 314, and 316 to gate bond pad 302. It should be noted that the formation of gate contact portions 308 and 310 and gate contacts 314 and 316 is optional and may be included to reduce the series resistance of the polysilicon in trenches 304.

Figure 27:
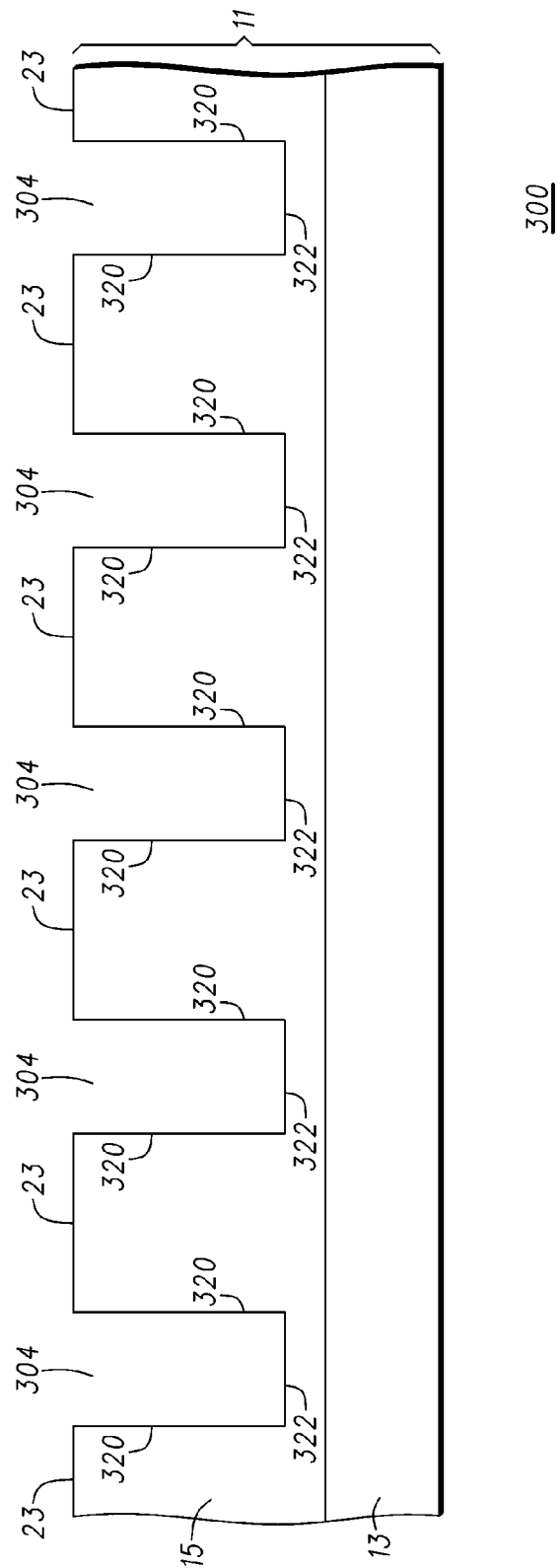
FIG. 27 is a cross-sectional view of the semiconductor component of FIG. 26 taken along section line 30-30, but at an early stage of manufacture.

Referring now to FIG. 27, plurality of trenches 304 having sidewalls 320 and floors 322 are formed in a portion of semiconductor material 11. Trenches 304 may be formed at the same time and using the same method as used for forming trenches 20, 21, and 42 of semiconductor component 10 in embodiments in which trenches 304 are included in conjunction with the embodiments of semiconductor component 10. It should be understood that FIG. 27 may be a cross-sectional view of the semiconductor component of FIG. 26 taken along section line 30-30 or section line 30A-30A of FIG. 26, but at an early stage of manufacture.

Figure 28:
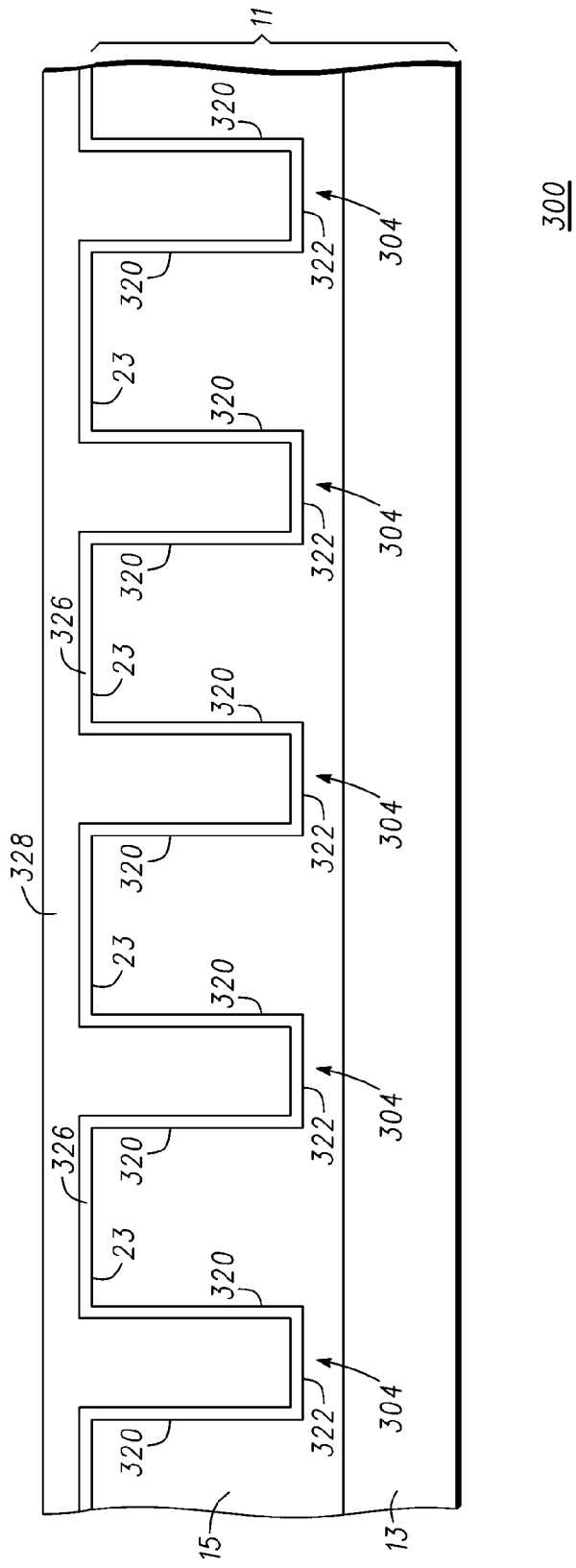
FIG. 28 is a cross-sectional view of the semiconductor component of FIG. 27 at a later stage of manufacture.

Referring now to FIG. 28, a layer of dielectric material 326 is formed over or from sidewalls 320 and over or from floors 322 in trenches 304. Preferably, dielectric material 326 is oxide having a thickness selected to support the breakdown voltage BVdss. Oxide layer 326 may be formed at the same time and using the same method as used for forming dielectric material 80 of semiconductor component 10 in embodiments in which oxide layer 326 is included in conjunction with the embodiments of semiconductor component 10. By way of example, the thickness of oxide layer 326 is at least 750 Angstroms for a breakdown voltage of about 30 volts. A layer of polysilicon 328 having a thickness ranging from about 3,500 Å to about 6,000 Å is formed on dielectric layer 326 and preferably fills trenches 304. When the conductivity type of epitaxial layer 15 is N-type, the conductivity type of polysilicon layer 328 is preferably N-type. Polysilicon layer 328 is annealed so that it is substantially free of voids. By way of example, polysilicon layer 328 is doped with phosphorus, has a thickness of about 5,000 Å, and is annealed at a temperature of about 1,100 Degrees Celsius (° C.) for about 20 minutes. Polysilicon layer 328 may be formed at the same time and using the same method as used for forming the polysilicon of shield electrodes 82 of semiconductor component 10 in embodiments in which polysilicon layer 328 included in conjunction with the embodiments of semiconductor component 10.

Figure 29:
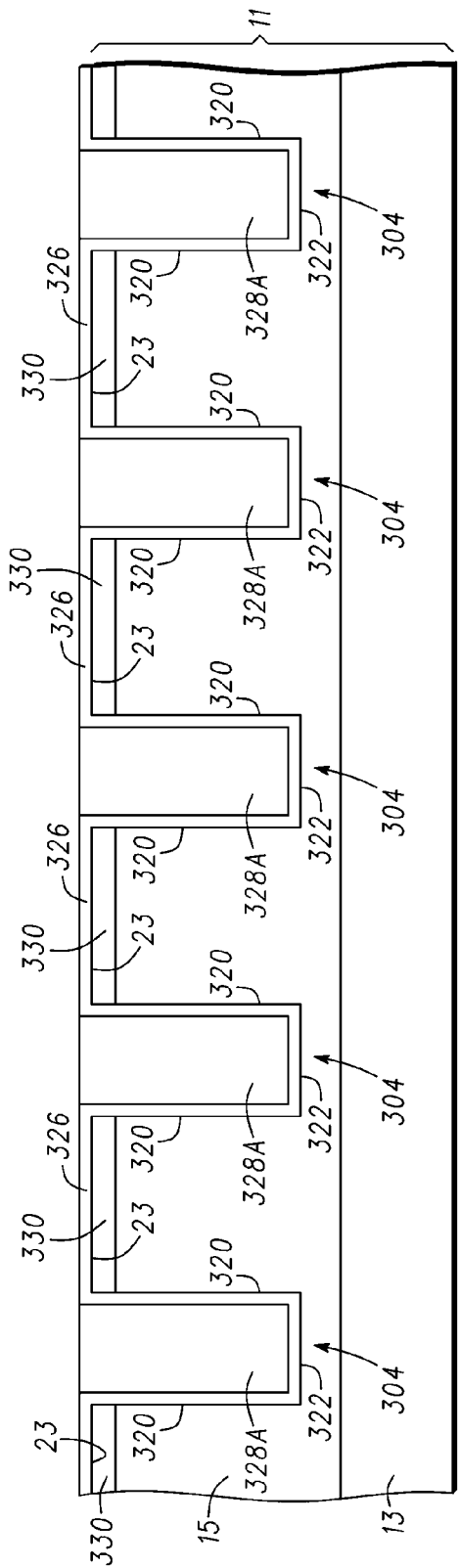
FIG. 29 is a cross-sectional view of the semiconductor component of FIG. 28 at a later stage of manufacture.

Referring now to FIG. 29, polysilicon layer 328 is planarized using, for example, a CMP process that is selective for the material of dielectric layer 326, i.e., dielectric layer 326 serves as an etch stop for the CMP process. Planarization of polysilicon layer 328 leaves portions 328A of polysilicon layer 328 in trenches 304. The method for planarizing polysilicon layer 328 is not a limitation of the present invention.

Other suitable planarization techniques include wet etching techniques, dry etching techniques, combinations of wet and dry etching techniques, or the like. Optionally, an impurity material of N-type conductivity is implanted into the portions of epitaxial layer 15 that are laterally adjacent to trenches 304. The implant forms doped regions 330 which help prevent epitaxial layer 15 from becoming fully depleted. The distance to which doped regions 330 extend into epitaxial layer 15 is not a limitation of the present invention. Thus, doped regions 330 can extend to a distance that ranges from surface 23 to floors 322 or even deeper. It should be noted that FIGS. 27-29 are cross sectional views that may be taken along section line 30-30 or section line 30A-30A of FIG. 26.

Figure 30:
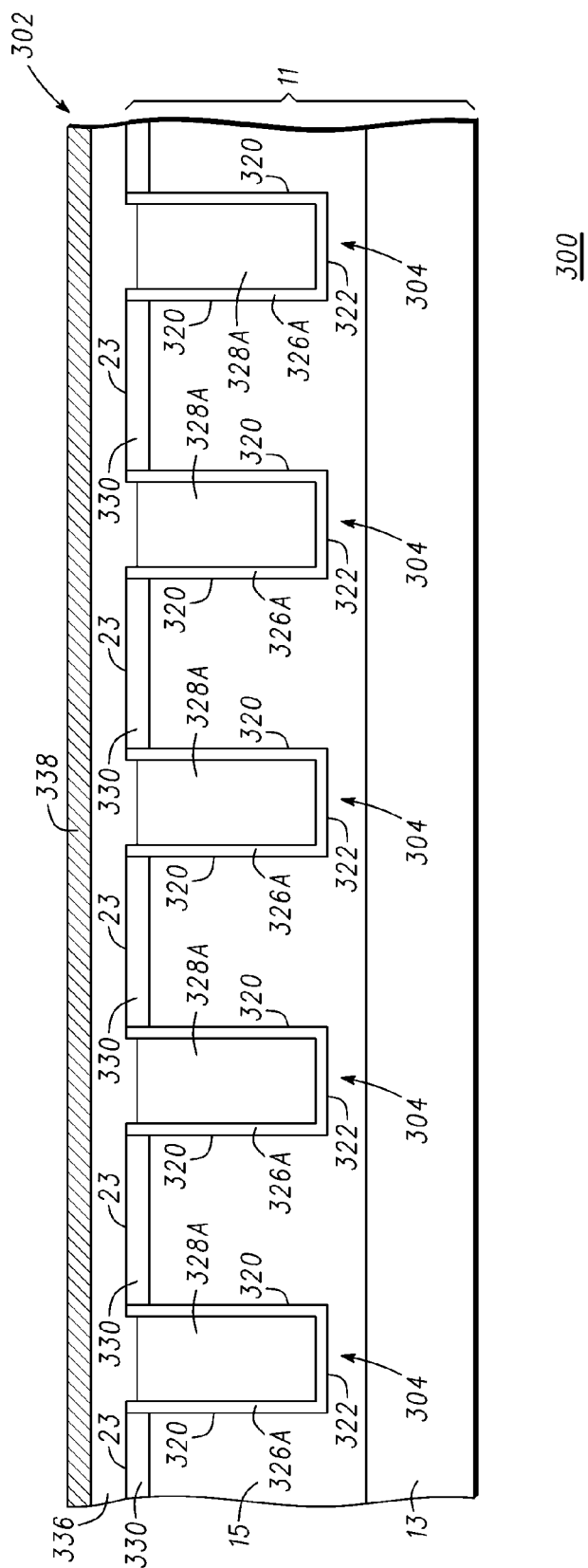
FIG. 30 is a cross-sectional view of the semiconductor component of FIG. 29 in accordance with another embodiment of the present invention.

FIG. 30 is a cross-sectional view of semiconductor component 300 taken along section line 30-30 of FIG. 26. What is shown in FIG. 30 is polysilicon portions 328A recessed using an isotropic etch that selectively removes polysilicon. By way of example, polysilicon portions 328A are recessed using a reactive ion etch. Portions of dielectric layer 326 over surface 23 are stripped using an isotropic wet etch leaving portions 326A in trenches 304. A suitable etchant for stripping dielectric layer 326 is a buffered hydrofluoric acid solution. A layer of dielectric material 336 having a thickness ranging from about 3,000 Å to about 12,000 Å is formed over polysilicon portions 328A and surface 23. It should be noted that dielectric layer 336 is the same interlayer dielectric material as formed over the active region. By way of example, dielectric layer 336 is oxide. A metallization system 338 such as, for example, an aluminum-copper (AlCu) metallization system, is formed on dielectric layer 336. Layers 336 and 338 form gate bond pad 302.

Figure 30A:
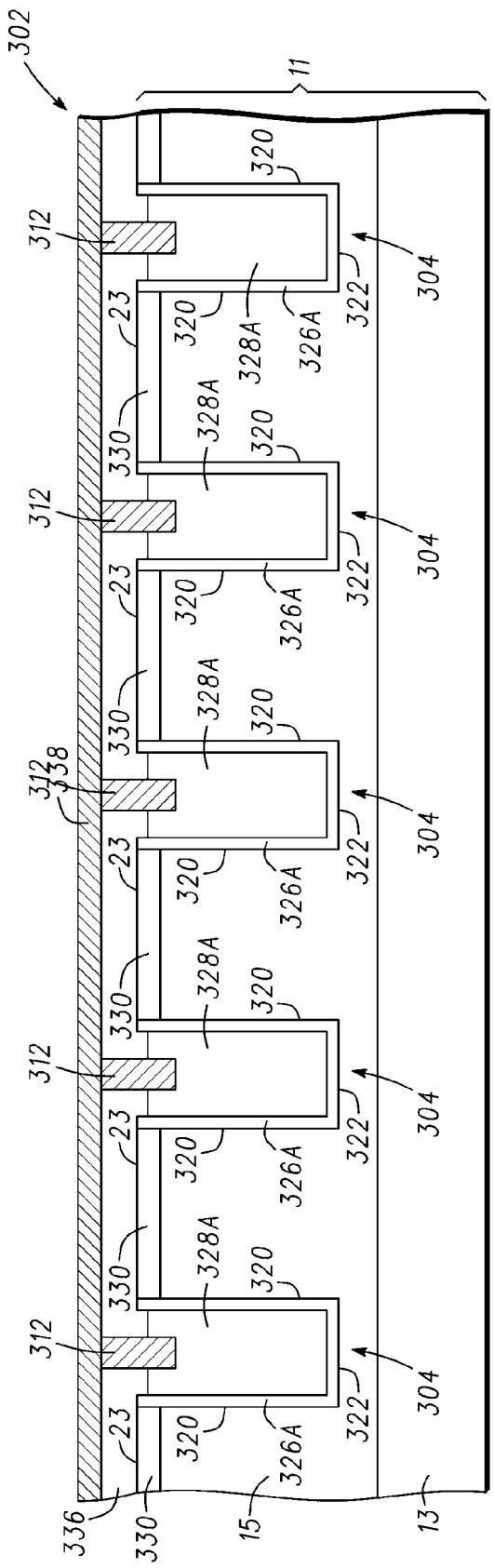
FIG. 30A is a cross-sectional view of the semiconductor component of FIG. 26 taken along section line 30A-30A.

FIG. 30A is a cross-sectional view of semiconductor component 300 taken along section line 30A-30A of FIG. 26. The description of FIG. 30A is similar to FIG. 30 except that FIG. 30A also shows electrical contacts 312 that extend through dielectric layer 336 into epitaxial layer 15. Suitable materials for electrical contacts 312 are the same as for electrical contacts 98, 100, 102, 102A, 134, and 116 described above with reference to semiconductor component 10.

Figure 31:
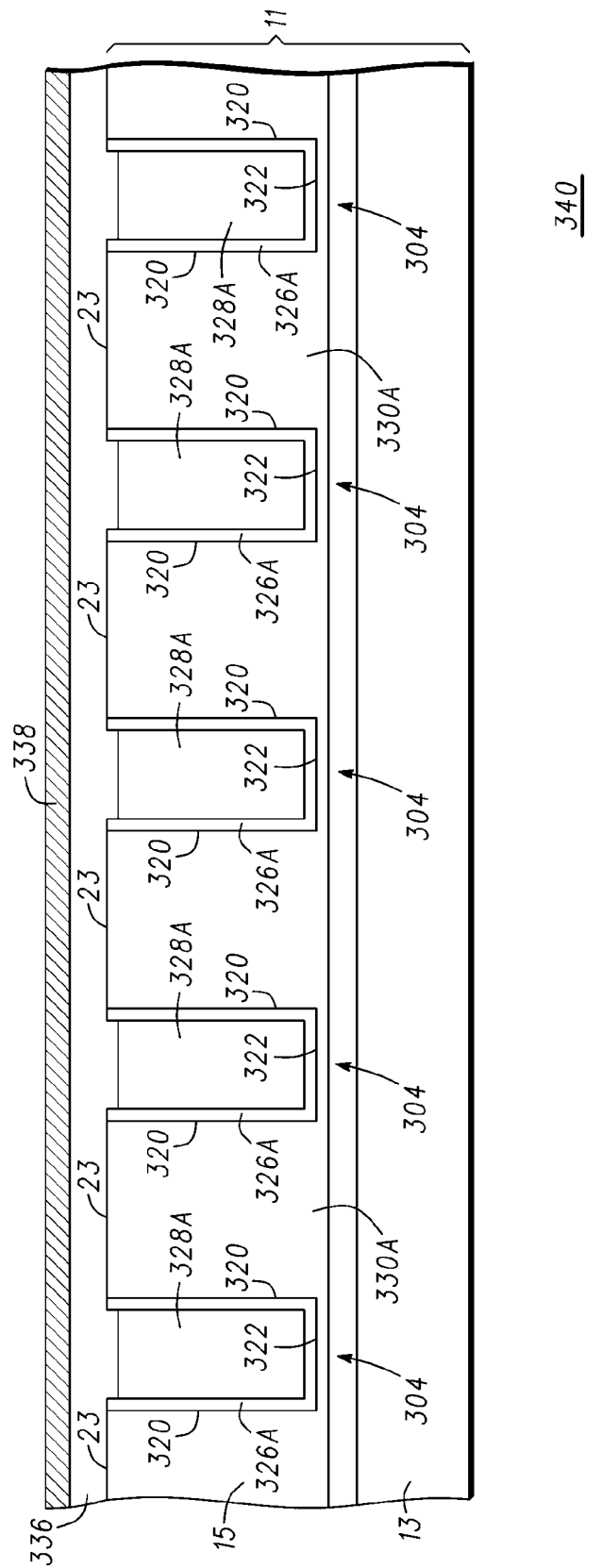
FIG. 31 is a cross-sectional view of the semiconductor component of FIG. 26 in accordance with another embodiment of the present invention, where the cross-sectional view is taken along section line 30-30.

FIG. 31 is a cross-sectional view of a semiconductor component 340 in accordance with another embodiment of the present invention. Semiconductor component 340 is similar to semiconductor component 300 except that doped region 330 has been replaced by doped region 330A, where doped region 330A extends to a region between the floors 332 of trenches 304 and an interface between epitaxial layer 15 and substrate layer 13. The cross-sectional view of FIG. 31 may be taken along section line 30-30 shown in FIG. 26.

Figure 32:
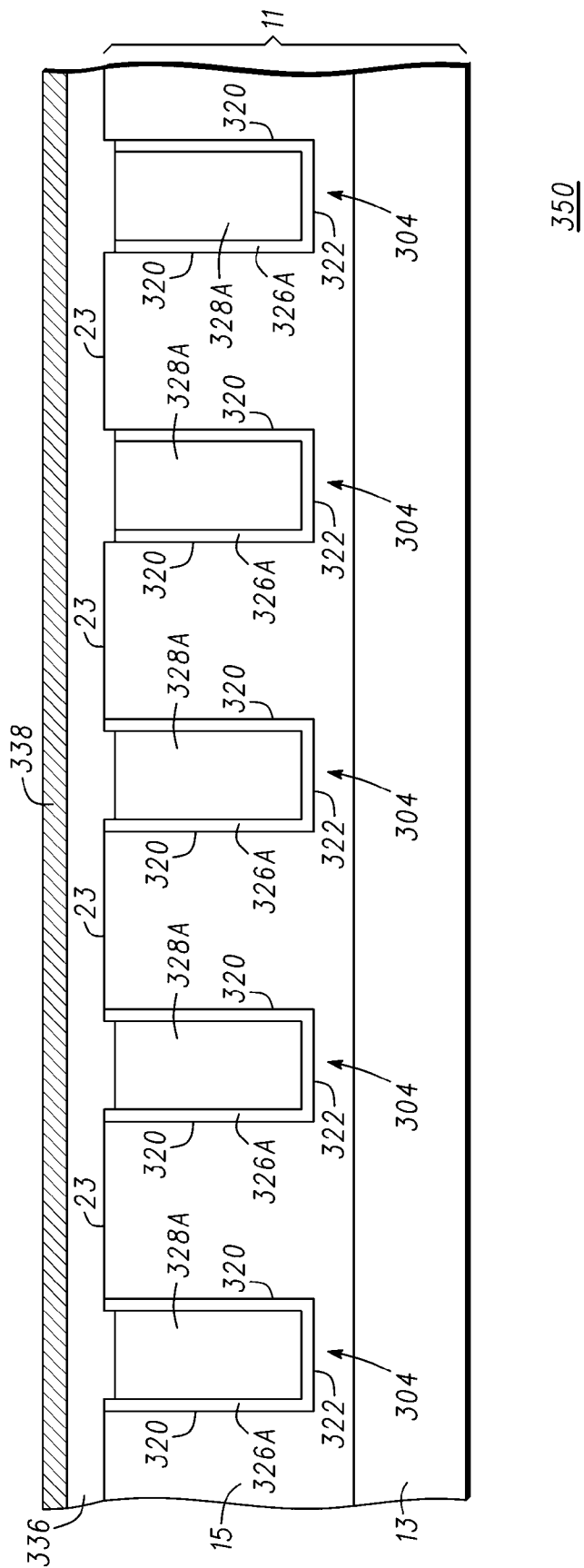
FIG. 32 is a cross-sectional view of the semiconductor component of FIG. 26 in accordance with another embodiment of the present invention, where the cross-sectional view is taken along section line 30-30.

FIG. 32 is a cross-sectional view of a semiconductor component 350 in accordance with another embodiment of the present invention. Semiconductor component 350 differs from semiconductor components 300 and 300A in that doped regions 330 and 330A are absent from semiconductor component 350. The cross-sectional view of FIG. 31 may be taken along section line 30-30 shown in FIG. 26.

Figure 33:
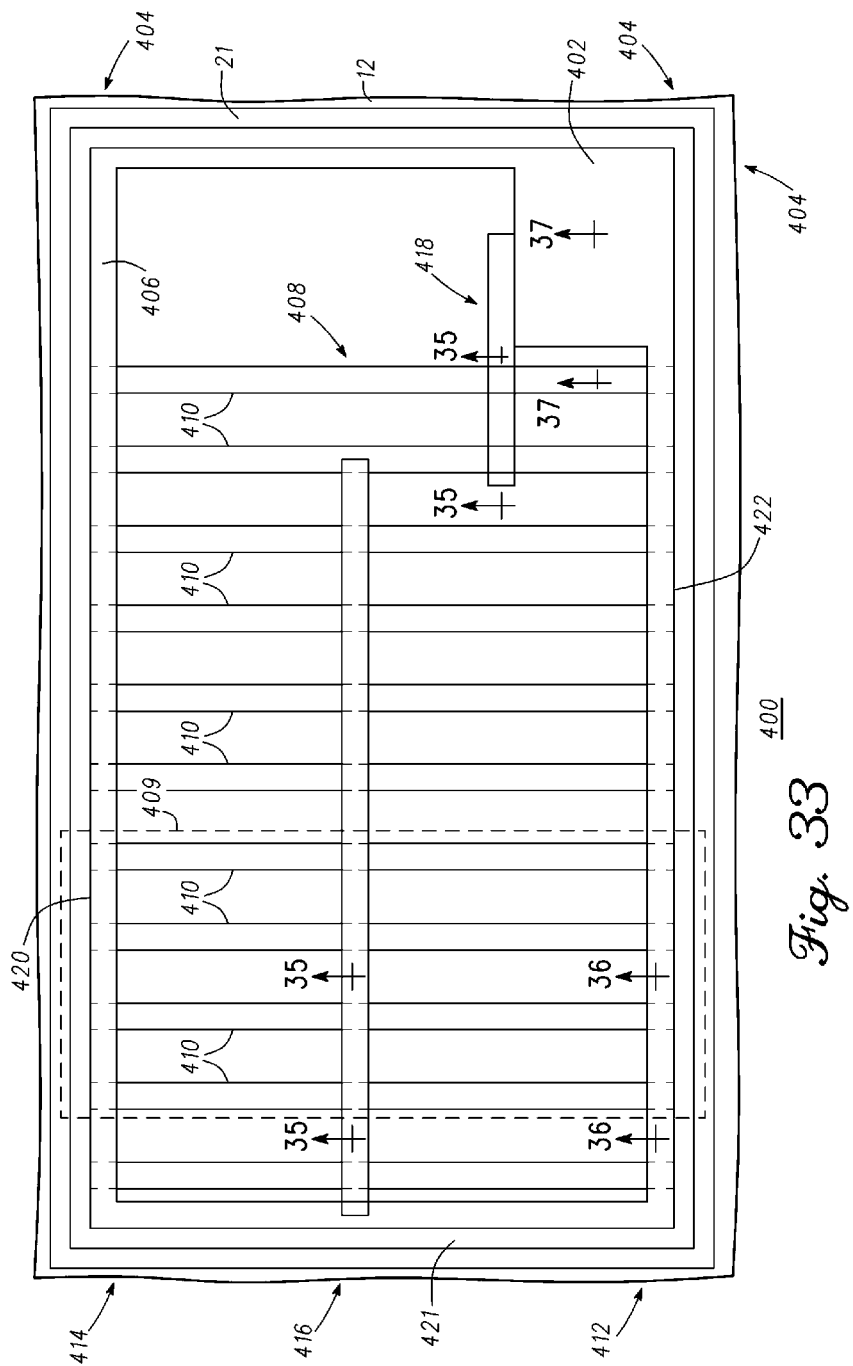
FIG. 33 is a plan view of a semiconductor component during manufacture in accordance with another embodiment of the present invention.

FIG. 33 is an enlarged plan view of a semiconductor component 400 in accordance with another embodiment of the present invention. What is shown in FIG. 33 is a portion of a semiconductor die or semiconductor chip 12 in which a gate bond pad 402 is formed. A metal gate feed 406 is formed in an edge region 404 and partially around an active area 408. A plurality of trenches 410 are formed in semiconductor material 11 of semiconductor chip 12. Trenches 410 are connected together by trench 21. More particularly, the ends of trenches 410 are connected to trench 21. Trenches 410 have gate contact portions 412 and 414 and shield contact portions 416 and 418. Although portion 421 of metal gate feed 406, i.e., the portion of metal gate feed 406 that is near the portion of semiconductor component 400 opposite from gate bond pad 402 is shown as extending from contact portion 412 to contact portion 414, this is not a limitation of the present invention. For example, portions of metal gate feed 406 may be absent from the regions near shield contact portion 416. Portion 409 of trenches 410 and contact portions 412, 414, 416, and 418 are further shown and described with reference to FIGS. 34-37.

Figure 34:
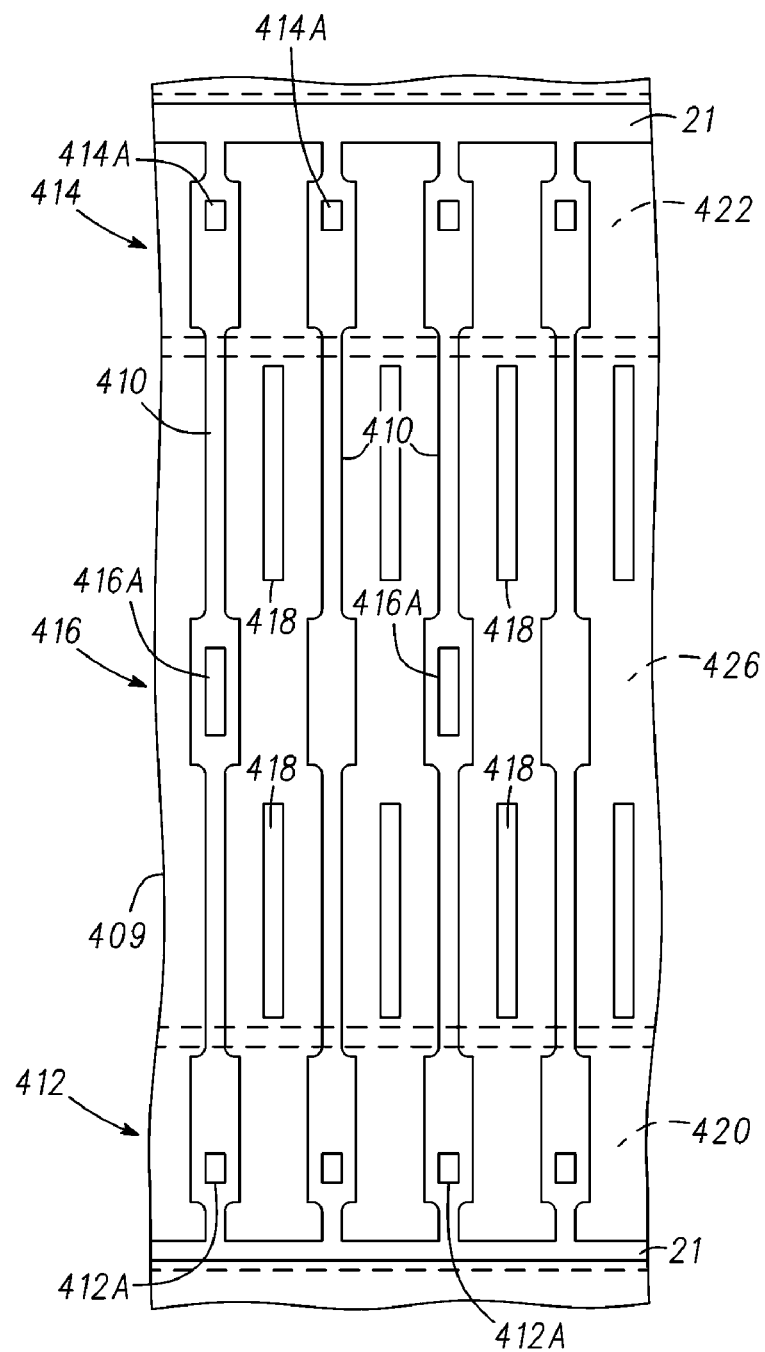
FIG. 34 is a plan view of a portion of the semiconductor component of FIG. 33.

Referring now to FIG. 34, an expanded plan view of a portion of semiconductor component 400 is illustrated. Trenches 410 are shown in greater detail compared to FIG. 33. Trenches 410 extend from gate contact region 412 to gate contact region 414 and include shield contact portions 416. Gate contact portions 412 and 414 and shield contact portions 416 of trenches 410 may be wider than the portions of trenches 410 between gate contact portions 412 and shield contact portions 416 and they may be wider than the portions of trenches 410 between gate contact portions 414 and shield contact portions 416 to allow for the formation of gate contact interconnects 412A and 414A and shield contacts 416A. Gate contacts 412A are electrically connected to gate metal feed 420 in gate contact region 412, gate contacts 414A are electrically connected to gate metal feed 422 in gate contact region 414, and shield contacts 416A are electrically connected to source metal 426. FIG. 34 illustrates portions 420 and 422 of metal gate feed 406 and source metal 426. Portion 420 is over contact portion 412 that is between adjacent broken lines, portion 422 is over contact portion 414 that is between adjacent broken lines, and source contact 426 is over the region that is between adjacent broken lines that includes contacts 416A and 418.

Figure 35:
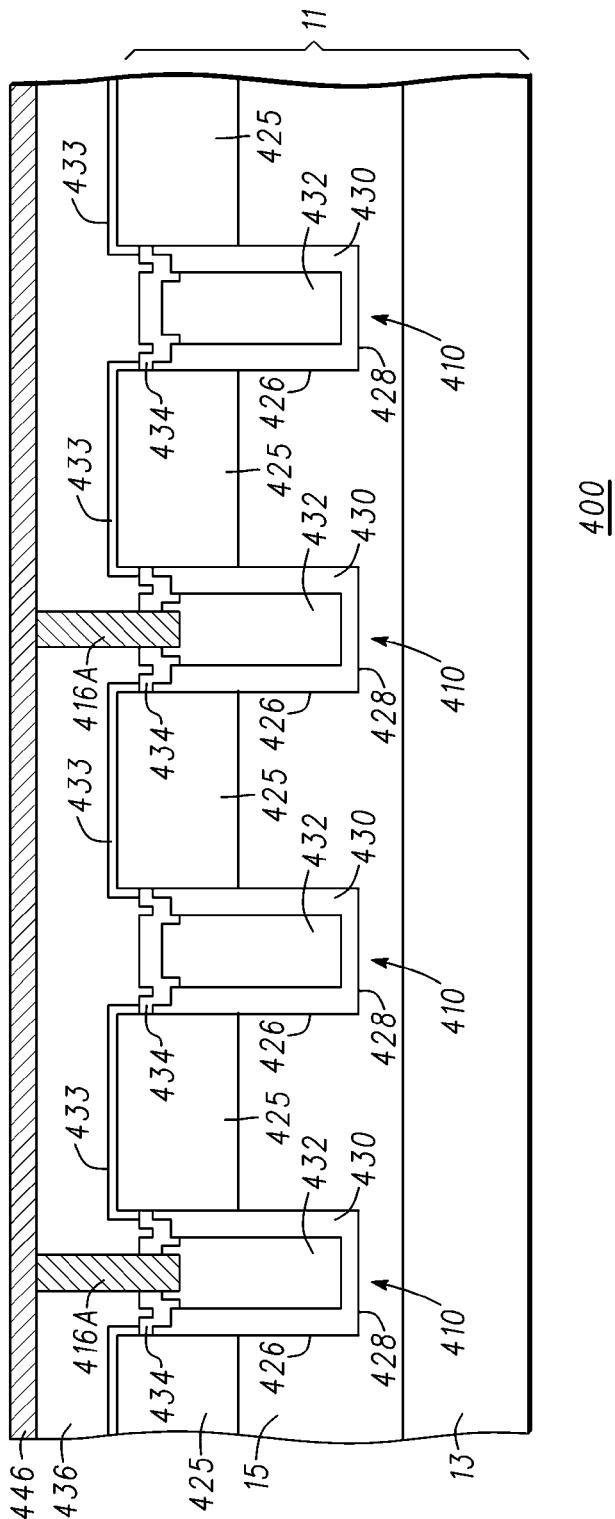
FIG. 35 is a cross-sectional view of the semiconductor component of FIG. 33 taken along section line 35-35 of FIG. 33, but at a later stage of manufacture.

FIG. 35 is a cross-sectional view of trenches 410 taken along section line 35-35 of FIG. 33. What is shown in FIG. 35 is shield contacts 416A during manufacture. A dielectric material 430 is formed over sidewalls 426 and floors 428 of trenches 410 and shield electrodes 432 are formed over dielectric material 430. A dielectric material 434 is formed over shield electrodes 432 and a gate dielectric material 433 is formed over portions of sidewalls 426 and over epitaxial layer 15. A layer of dielectric material 436 is formed over epitaxial layer 15 and openings (not shown) are formed through portions of dielectric layer 436 and dielectric material 434 to expose portions of shield electrodes 432. Shield contacts 416A are formed to contact shield electrodes 432. A shield electrode metal layer 446 is formed in contact with shield contacts 416A. Shield electrode metal layer 446 may be the same as the source metal layer. Techniques for forming dielectric material 430, shield electrodes 432, dielectric material 434 and 436, shield contacts 416A, and shield electrode metal layer 446 have been described above. In accordance with the example shown in FIGS. 33-37, shield contacts 416A are formed to contact a portion of a shield electrode 432 every other trench. However, this is not a limitation of the present invention. Shield contacts 416A may be formed such that a shield contact 416A is made to contact a portion of a shield electrode in every trench, or shield contacts 416A may be formed such that a shield contact 416A is made to contact a shield electrode 432 in one of N trenches, or a shield contact 416A is made to contact a shield electrode 432 in a variable number of trenches. FIG. 35 illustrates an embodiment in which N is 2 such that a shield contact 416A is made to contact a shield electrode 432 in one of two trenches. It should be noted that shield electrodes 432 in trenches 410 are coupled together by the shield electrode portions formed in trench 21.

Figure 36:
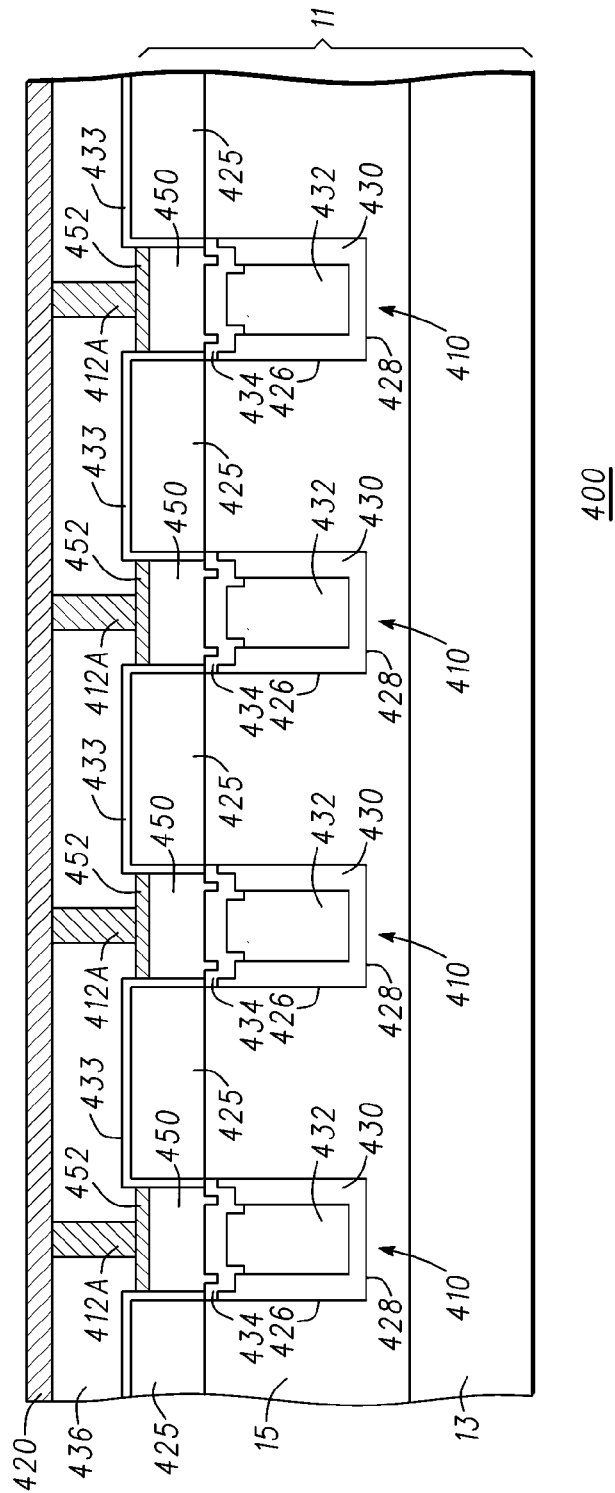
FIG. 36 is a cross-sectional view of the semiconductor component of FIG. 33 taken along section line 36-36 of FIG. 33, but at a later stage of manufacture.

FIG. 36 is a cross-sectional view of trenches 410 taken along section line 36-36 of FIG. 33. What is shown in FIG. 36 is gate contacts 412A during manufacture. It should be noted that the formation of gate contacts 414A is the same as the formation of gate contacts 412A. Dielectric material 430 is formed over the sidewalls 426 and floors 428 of trenches 410 and shield electrodes 432 are formed over dielectric material 430. A dielectric material 434 is formed over shield electrodes 432 and a gate dielectric material 433 is formed over portions of sidewalls 426 and over epitaxial layer 15. Gate conductors 450 are formed over dielectric material 434 and silicide layers 452 are formed from portions of gate conductors 450. Openings (not shown) are formed through portions of dielectric layer 436 to expose silicide layers 452 and shield electrode 432. Gate contacts 412A are formed to contact silicide layers 452 and shield contacts 414A are formed to contact shield contact 432. A metal gate feed 420 is formed in contact with gate contacts 412A. Techniques for forming dielectric material 430, gate electrodes 450, dielectric material 433, 434, and 436, gate contacts 412A shield contacts 414A, and metal gate interconnect 420 have been described above.

Figure 37:
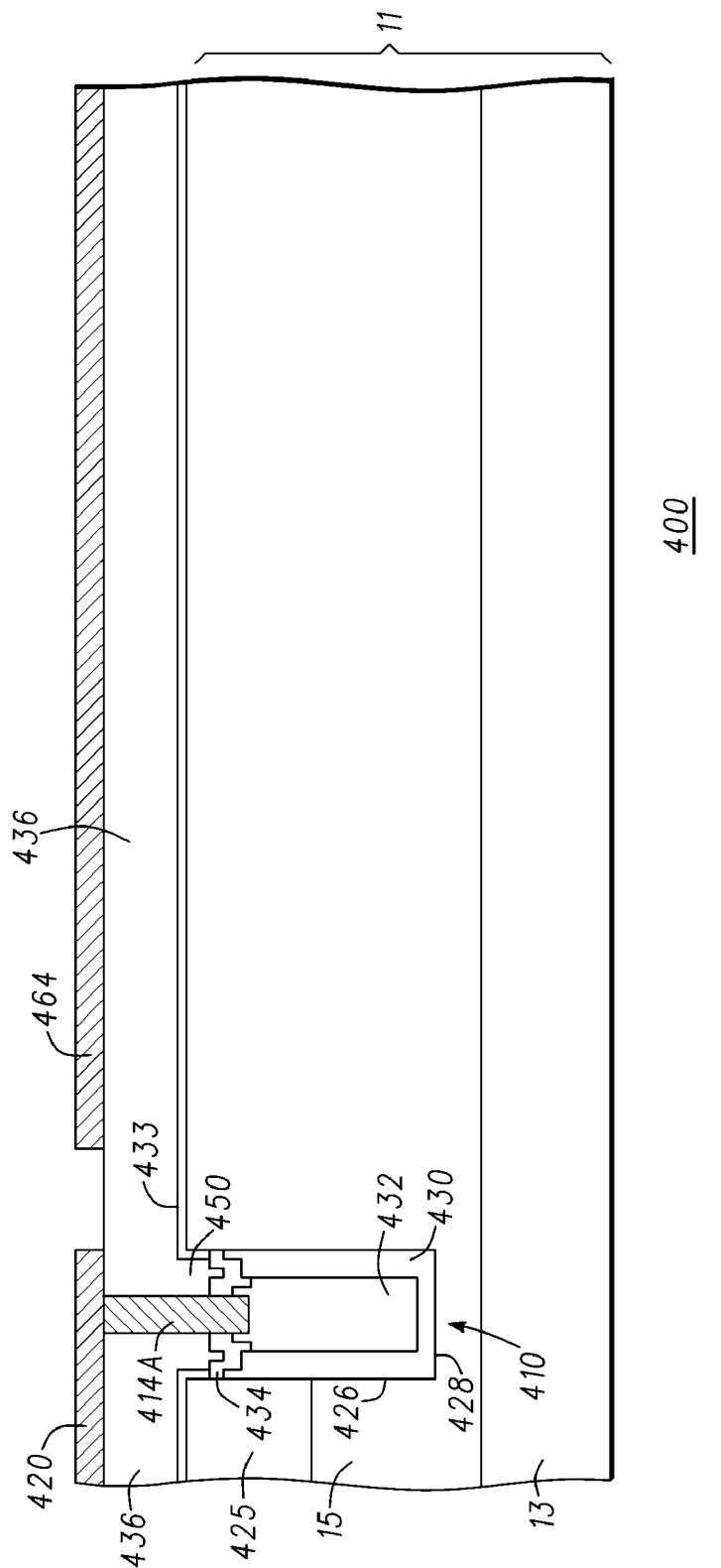
FIG. 37 is a cross-sectional view of the semiconductor component of FIG. 33 taken along section line 37-37 of FIG. 33, but at a later stage of manufacture.

FIG. 37 is a cross-sectional view of trenches 410 taken along section line 37-37 of FIG. 33. A gate pad metallization system 464 is formed over a portion of dielectric layer 436. By way of example, gate pad metallization system 464 is formed from the same layer of electrically conductive material as metal gate interconnect 420.

FIG. 38 is an enlarged plan view of a semiconductor component 10A in accordance with another embodiment of the present invention. What is shown in FIG. 38 is a portion of a semiconductor die or semiconductor chip 12 having edge regions 14 and a center region 16. Semiconductor component 10A is similar to semiconductor component 10 illustrated and described with reference to FIGS. 2-25, except that in one portion of semiconductor chip 12 two trenches 42 are adjacent to each other and in another portion of semiconductor chip 12 three trenches 42 are adjacent to each other. Except for this difference, the description of semiconductor component 10A is similar to that of semiconductor component 10. It should be noted that the number of trenches 42 that are adjacent to each other and the number of trenches 20 between trenches 42 are not limitations of the present invention.

Although certain preferred embodiments and methods have been disclosed herein, it will be apparent from the foregoing disclosure to those skilled in the art that variations and modifications of such embodiments and methods may be made without departing from the spirit and scope of the invention. For example, a semiconductor component may be comprised of semiconductor component 10, 300, and 400; or a semiconductor component may be comprised of semiconductor component 10 and semiconductor component 300; or a semiconductor component may be comprised of semiconductor component 10 and 400; or a semiconductor component may be comprised of semiconductor component 300 and 400; or combinations thereof. It is intended that the invention shall be limited only to the extent required by the appended claims and the rules and principles of applicable law.

What is claimed is:
1. A method for manufacturing a semiconductor component, comprising:
provide a semiconductor material having a major surface, an active area, an inactive area, and a plurality of trenches, wherein each trench of the plurality of trenches has first and second sidewalls and a floor, and wherein the trenches are positioned so that the trenches of the plurality of trenches are not within other trenches of the plurality of trenches;

forming a first dielectric material over the first and second sidewalls and the floors of first and second trenches of the plurality of trenches, wherein the first and second trenches are formed in different portions of the semiconductor material;

forming a first electrically conductive material over a portion of the first dielectric material in the first trench;

forming a second electrically conductive material over a portion of the first dielectric material in the second trench;

forming a second dielectric material over the first and second electrically conductive materials;

forming a layer of electrically conductive material in contact with the second dielectric material;

forming a first electrical conductor from the layer of electrically conductive material that is over a first portion of the second dielectric material;

forming a second electrical conductor from the layer of electrically conductive material that is over a second portion of the second dielectric material;

forming a gate electrode over a first portion of the major surface;

forming a source electrode over a second portion of the major surface;

electrically coupling the first electrical conductor to the gate electrode; and electrically coupling the first electrically conductive material to the to the source electrode.

2. The method of claim 1, further including coupling the second electrically conductive material to the gate electrode.

3. The method of claim 1, further including electrically coupling the second electrical conductor to the gate electrode.

4. The method of claim 1, wherein the first and second electrically conductive materials and the first and second electrical conductors comprise polysilicon.

5. The method of claim 1, further including forming the first and second electrical conductors in the active area.

6. The method of claim 1, further including forming a first portion of the first electrically conductive material in the inactive area.

7. The method of claim 6, wherein forming the first portion of the first electrically conductive material in the inactive area includes forming the first portion of the first electrically conductive material to vertically fill more of the first trench than a second portion of the first electrically conductive material, wherein the second portion of the first electrically conductive material is in the active area.

8. The method of claim 6, further including forming a first portion of the second electrically conductive material in the inactive area.

9. The method of claim 8, wherein forming the first portion of the second electrically conductive material in the inactive area includes forming the first portion of the second electrically conductive material to vertically fill more of the second trench than a second portion of the second electrically conductive material, wherein the second portion of the second electrically conductive material is in the active area.

10. The method of claim 1, further including forming electrical contacts to at least the first electrically conductive material in the inactive area.

11. The method of claim 1, wherein electrically coupling the first electrically conductive material to the source electrode includes electrically coupling the first electrically conductive material to the source electrode at a single location.

12. A method for manufacturing a semiconductor component, comprising:

providing a semiconductor material having a major surface, an active area, and an inactive area;

forming a first trench in an inactive area of the semiconductor material, the first trench having first and second sidewalls and a floor;

forming at least second and third trenches in the semiconductor material, the second and third trenches having first and second sidewalls, a floor, and first and second ends, wherein the second and third trenches are substantially parallel to each other, and wherein the first end of the second trench is connected to the first trench and the first end of the third trench is spaced apart from the first trench, and wherein the second and third trenches are formed in different portions of the semiconductor material and are nonoverlapping with the first trench;

forming a source electrode over a first portion of the major surface; and forming a gate electrode over a second portion of the major surface.

13. The method of claim 12, further including:

forming a dielectric material on the sidewalls and the floors of the first, second, and third trenches;

forming a first electrical conductor on the dielectric material in the first trench;

forming a second electrical conductor on the dielectric material in the second trench; and forming a third electrical conductor on the dielectric material in the third trench.

14. The method of claim 13, further including:

forming a fourth trench in the semiconductor material, the fourth trench having first and second sidewalls, first and second ends, and a floor, wherein the third trench is between the second and fourth trenches, the second, third, and fourth trenches are substantially parallel to each other, and the first end of the fourth trench is connected to the first trench;

forming the dielectric material on the sidewalls and floor of the fourth trench; and forming a fourth electrical conductor on the dielectric material in the fourth trench.

15. The method of claim 14, further including coupling the first, second, and fourth electrical conductors to the source electrode.

16. The method of claim 15, further including:

forming a second dielectric material over a first portion of the second electrical conductor, a first portion of the third electrical conductor, and a first portion of the fourth electrical conductor;

forming a fifth electrical conductor over a portion of the second dielectric material that is over the first portion of the second electrical conductor;

forming a sixth electrical conductor over a portion of the second dielectric material that is over the first portion of the third electrical conductor;

forming a seventh electrical conductor over a portion of the second dielectric material that is over the first portion of the fourth electrical conductor; and electrically coupling the third electrical conductor to the gate electrode.

17. The method of claim 13, further including coupling the third electrical conductor to the gate electrode.

18. The method of claim 13, further including forming a fourth trench in the semiconductor material, the fourth trench having first and second sidewalls, first and second ends, and a floor, wherein the fourth trench is adjacent to the third trench, the second, third, and fourth trenches are substantially parallel to each other, and the first end of the fourth trench is spaced apart from first trench.

19. A method for manufacturing a semiconductor component, comprising:
  providing a semiconductor material having a major surface, an active area, an inactive area, a plurality of trenches, wherein each trench of the plurality of trenches has first and second sidewalls and a floor, and wherein each trench of the plurality of trenches is formed in different portions of the semiconductor material and are nonoverlapping with each other;
  forming a first dielectric material over the first and second sidewalls and the floor of a first trench of the plurality of trenches;
  forming a first electrical conductor over a portion of the first dielectric material in the first trench;
  forming a gate electrode over a first portion of the major surface;
  forming a gate pad over the first trench; and
  electrically connecting the first conductor to the gate electrode at least one location along the first trench.

20. The method of claim 19, further including forming a doped layer in a portion of the semiconductor material adjacent to the first trench and adjacent to the major surface.

21. The method of claim 19, further including forming a doped layer in a portion of the semiconductor material adjacent to the first trench.

22. A semiconductor component, comprising
  a semiconductor material having a major surface, an active area, an inactive area, and a plurality of trenches, wherein at least first and second trenches of the plurality of trenches have first and second sidewalls and a floor, and wherein the first and second trenches are formed in different portions of the semiconductor material and are nonoverlapping with other trenches of the plurality of trenches;
  a first dielectric material over the first and second sidewalls and the floor of the first and second trenches of the plurality of trenches;
  a first polysilicon structure over a portion of the first dielectric material in the first trench;
  a second polysilicon structure over a portion of the first dielectric material in the second trench;
  a second dielectric material over the first and second polysilicon structures;
  a third polysilicon structure over a first portion of the second dielectric material;
  a fourth polysilicon structure over a second portion of the second dielectric material;
  a gate electrode over a first portion of the major surface, wherein the third polysilicon structure is coupled to the gate electrode; and
  a source electrode over a second portion of the major surface, wherein the third polysilicon structure is coupled to the gate electrode.

23. The semiconductor component of claim 22, wherein the second and fourth polysilicon structures are coupled to the gate electrode.

24. A semiconductor component, comprising:
  a semiconductor material having a major surface, an active area, and an inactive area;
  a first trench in an inactive area of the semiconductor material, the first trench having first and second sidewalls and a floor;
  at least second and third trenches in the semiconductor material, the second and third trenches having first and second sidewalls, a floor, and first and second ends, wherein the second and third trenches are substantially parallel to each other, and wherein the first end of the second trench is connected to the first trench and the first end of the third trench is spaced apart from the first trench, and wherein the second and third trenches are formed in different portions of the semiconductor material and are nonoverlapping with the first trench;
  a source electrode over a first portion of the major surface; and
  a gate electrode over a second portion of the major surface.

25. A semiconductor component, comprising:
  a semiconductor material having a major surface, an active area, an inactive area, and a plurality of trenches, wherein each trench of the plurality of trenches has first and second sidewalls and a floor, and wherein each trench is formed in different portions of the semiconductor material and are nonoverlapping with other trenches of the plurality of trenches;
  a first dielectric material over the first and second sidewalls and the floor of a first trench of the plurality of trenches;
  a first polysilicon structure over a portion of the first dielectric material in the first trench; and
  a gate electrode over a first portion of the major surface, wherein the first polysilicon structure is coupled to the gate electrode at one or more locations along the first trench.

26. The semiconductor component of claim 25, further including a gate pad over the first trench.

* * * * *